(12) United States Patent
Choi et al.

(10) Patent No.: US 11,887,951 B2
(45) Date of Patent: Jan. 30, 2024

(54) THREE-DIMENSIONAL SEMICONDUCTOR MEMORY DEVICE AND ELECTRONIC SYSTEM INCLUDING THE SAME

(71) Applicant: Samsung Electronics Co., Ltd., Suwon-si (KR)

(72) Inventors: Moorym Choi, Yongin-si (KR); Jiyoung Kim, Seoul (KR); Sanghee Yoon, Suwon-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 160 days.

(21) Appl. No.: 17/529,462

(22) Filed: Nov. 18, 2021

(65) Prior Publication Data

US 2022/0320025 A1 Oct. 6, 2022

(30) Foreign Application Priority Data

Apr. 6, 2021 (KR) .................... 10-2021-0044569

(51) Int. Cl.
*H01L 23/00* (2006.01)
*H01L 25/065* (2023.01)
(Continued)

(52) U.S. Cl.
CPC .............. *H01L 24/08* (2013.01); *H01L 24/05* (2013.01); *H01L 24/80* (2013.01); *H01L 25/0657* (2013.01); *H01L 25/18* (2013.01); *H01L 25/50* (2013.01); *H10B 41/27* (2023.02); *H10B 43/27* (2023.02); *H01L 2224/05147* (2013.01); *H01L 2224/08145* (2013.01); *H01L 2224/80895* (2013.01); *H01L 2224/80896* (2013.01);
(Continued)

(58) Field of Classification Search
CPC ......... H01L 24/08; H01L 24/05; H01L 24/80; H01L 25/0657; H01L 25/18; H01L 2224/08145; H01L 2224/80895; H01L 2924/1431; H10B 41/27; H10B 43/27
See application file for complete search history.

(56) References Cited

U.S. PATENT DOCUMENTS 8,971,118 B2 3/2015 Jin et al.
10,062,707 B2 8/2018 Lee
(Continued)

*Primary Examiner* — Mamadou L Diallo
(74) *Attorney, Agent, or Firm* — Harness, Dickey & Pierce, P.L.C.

(57) ABSTRACT

A three-dimensional semiconductor memory device may include a first substrate including a cell array region and a cell array contact region, a peripheral circuit structure on the first substrate, and a cell array structure. The cell array structure may include a stack on the peripheral circuit structure, first vertical channel structures and second vertical channel structures on the cell array region and penetrating the stack, and a second substrate connected to the first vertical channel structures and second vertical channel structures. The stack may be between the peripheral circuit structure and the second substrate. The second substrate may include a first portion and a second portion. The first portion may contact the first vertical channel structures and may be doped a first conductivity type. The second portion may contact the second vertical channel structures and may be doped a second conductivity type different from the first conductivity type.

20 Claims, 29 Drawing Sheets

(51) Int. Cl.
  *H01L 25/18* (2023.01)
  *H01L 25/00* (2006.01)
  *H10B 41/27* (2023.01)
  *H10B 43/27* (2023.01)

(52) U.S. Cl.
  CPC ............... *H01L 2924/1431* (2013.01); *H01L 2924/14511* (2013.01)

(56) References Cited

U.S. PATENT DOCUMENTS

| | | | |
|---|---|---|---|
| 10,153,292 B2* | 12/2018 | Kim | H10B 43/35 |
| 10,770,477 B2 | 9/2020 | Lee et al. | |
| 10,790,358 B2 | 9/2020 | Choi et al. | |
| 10,854,631 B2 | 12/2020 | Kim et al. | |
| 2017/0352680 A1* | 12/2017 | Shin | H01L 23/535 |
| 2019/0067308 A1* | 2/2019 | Yun | H10B 43/27 |
| 2019/0267333 A1 | 8/2019 | Hong et al. | |
| 2020/0185400 A1 | 6/2020 | Park et al. | |
| 2021/0082865 A1* | 3/2021 | Baraskar | H01L 25/0657 |
| 2021/0202522 A1* | 7/2021 | Baek | H01L 23/5283 |
| 2022/0077129 A1* | 3/2022 | Sung | H01L 25/0657 |
| 2022/0115294 A1* | 4/2022 | Kim | H01L 24/08 |
| 2022/0208748 A1* | 6/2022 | Rabkin | H01L 24/80 |
| 2022/0254802 A1* | 8/2022 | Kwon | H01L 23/562 |
| 2022/0270972 A1* | 8/2022 | Wang | H01L 25/0657 |

\* cited by examiner

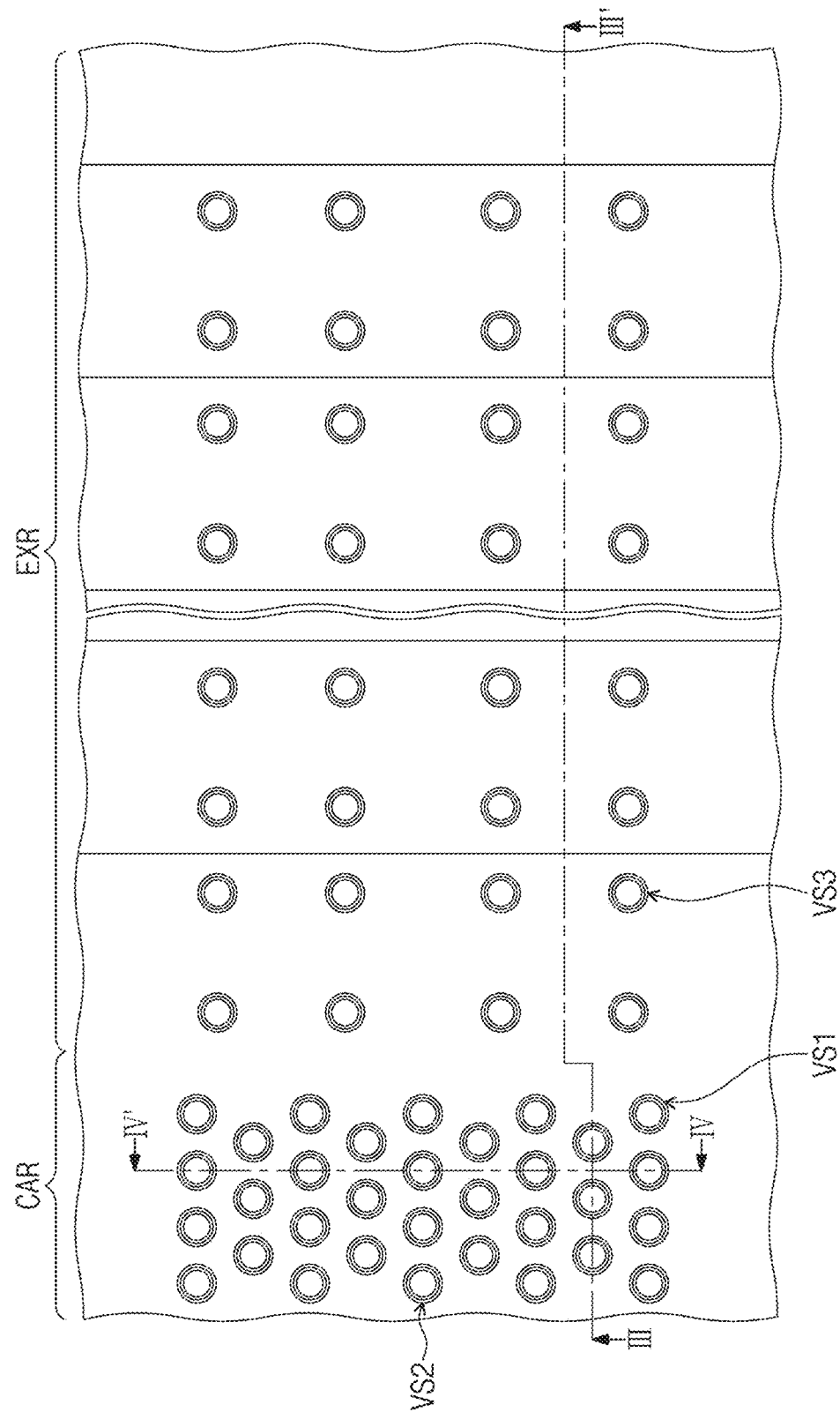

THREE-DIMENSIONAL SEMICONDUCTOR MEMORY DEVICE AND ELECTRONIC SYSTEM INCLUDING THE SAME

CROSS-REFERENCE TO RELATED APPLICATIONS

This U.S. non-provisional patent application claims priority under 35 U.S.C. § 119 to Korean Patent Application No. 10-2021-0044569, filed on Apr. 6, 2021 in the Korean Intellectual Property Office, the entire contents of which are hereby incorporated by reference.

BACKGROUND

The present disclosure relates to a three-dimensional semiconductor memory device, a method of fabricating the same, and/or an electronic system including the same, and in particular, a three-dimensional semiconductor memory device, which includes a peripheral circuit structure and a cell array structure that are bonded to each other through bonding pads, a method of fabricating the same, and/or an electronic system including the same.

A semiconductor device capable of storing a large amount of data may be required as a part of an electronic system. Higher integration of semiconductor devices may be required to satisfy consumer demands for large data storing capacity, superior performance, and inexpensive prices. In the case of two-dimensional or planar semiconductor devices, since their integration mainly may be determined by the area occupied by a unit memory cell, integration may be influenced by the level of a fine pattern forming technology. However, extremely expensive process equipment may be needed to increase pattern fineness and may set a practical limitation on increasing integration for two-dimensional or planar semiconductor devices. Thus, three-dimensional semiconductor memory devices including three-dimensionally arranged memory cells have recently been proposed.

SUMMARY

An embodiment of inventive concepts provides a three-dimensional semiconductor memory device with improved electrical characteristics and reliability and/or a method of fabricating the same.

An embodiment of inventive concepts provides an electronic system including the three-dimensional semiconductor memory device.

According to an embodiment of inventive concepts, a three-dimensional semiconductor memory device may include a first substrate including a cell array region and a cell array contact region; a peripheral circuit structure on the first substrate; and a cell array structure. The cell array structure may include a stack, first vertical channel structures, second vertical channel structures, and a second substrate. The stack may be on the peripheral circuit structure. The first vertical channel structures and the second vertical channel structures may be on the cell array region and may penetrate the stack. The second substrate may be connected to the first vertical channel structures and the second vertical channel structures. The stack may be between the peripheral circuit structure and the second substrate. The second substrate may include a first portion, a second portion, and a third portion. The first portion may be in contact with the first vertical channel structures and may be doped to have a first conductivity type. The second portion may be in contact with the second vertical channel structures and may be doped to have a second conductivity type different from the first conductivity type. The third portion may be on the cell array contact region and may be doped to have the second conductivity type.

According to an embodiment of inventive concepts, a three-dimensional semiconductor memory device may include a first substrate including a cell array region and a cell array contact region; a peripheral circuit structure including peripheral transistors, peripheral circuit interconnection lines, and first bonding pads; and a cell array structure. The peripheral transistors may be on the first substrate. The peripheral circuit interconnection lines may be on the peripheral transistors. The first bonding pads may be connected to the peripheral transistors through the peripheral circuit interconnection lines. The cell array structure may include second bonding pads, connection circuit interconnection lines, bit lines, a stack on the bit lines, first vertical channel structures, second vertical channel structures, third vertical channel structures, and a second substrate. The connection circuit interconnection lines may be on the second bonding pads. The bit lines may be connected to the second bonding pads through the connection circuit interconnection lines. The first vertical channel structures to the third vertical channel structures may penetrate the stack. The second substrate may be connected to the first vertical channel structures to the third vertical channel structures. The second bonding pads may be integrally bonded to the first bonding pads of the peripheral circuit structure. The stack may be located between the peripheral circuit structure and the second substrate. The stack may include interlayer dielectric layers and gate electrodes, which may be alternately and repeatedly stacked and may extend in a direction parallel to a top surface of the first substrate. The first vertical channel structures to the third vertical channel structures may be in vertical channel holes penetrating the stack. Each of the first vertical channel structures, the second vertical channel structures, and the third vertical channel structures may include a data storage pattern and a vertical semiconductor pattern enclosed by the data storage pattern. The data storage pattern may conformally cover an inner side surface of each of the vertical channel holes. The data storage pattern may include a blocking insulating layer, a charge storing layer, and a tunneling insulating layer, which may be sequentially stacked. The first vertical channel structures and the second vertical channel structures may be on the cell array region. The third vertical channel structures may be on the cell array contact region. The second substrate may include a first portion, a second portion, and a third portion. The first portion may be in contact with the first vertical channel structures and may be doped to have a first conductivity type. The second portion may be in contact with the second vertical channel structures and may be doped to have a second conductivity type different from the first conductivity type. The third portion may be in contact with the third vertical channel structures and may be doped to have the second conductivity type.

According to an embodiment of inventive concepts, an electronic system may include a three-dimensional semiconductor memory device and a controller connected to the three-dimensional semiconductor memory device. The three-dimensional semiconductor memory device may include a first substrate including a cell array region and a cell array contact region, a peripheral circuit structure on the first substrate, and a cell array structure. The cell array structure may include a stack, first vertical channel structures, second vertical channel structures, a second substrate, and an input/output pad. The stack may be on the peripheral circuit structure. The first vertical channel structures and the second vertical channel structures may be on the cell array region and may penetrate the stack. The second substrate may be connected to the first vertical channel structures and the second vertical channel structures. The input/output pad may be on the cell array structure. The stack may be located between the peripheral circuit structure and the second substrate. The second substrate may include a first portion, a second portion, and a third portion. The first portion may be in contact with the first vertical channel structures and may be doped to have a first conductivity type. The second portion may be in contact with the second vertical channel structures and may be doped to have a second conductivity type different from the first conductivity type. The third portion may be on the cell array contact region and may be doped to have the second conductivity type. The controller may be connected to the three-dimensional semiconductor memory device through the input/output pad. The controller may be configured to control the three-dimensional semiconductor memory device.

BRIEF DESCRIPTION OF THE DRAWINGS

FIGS. 9 and 11 are plan views illustrating a method of fabricating a three-dimensional semiconductor memory device, according to an embodiment of inventive concepts.

FIGS. 10A to 13A and 10B to 13B are sectional views, which are respectively taken along lines III-III' and IV-IV' of FIG. 9 or 11 to illustrate a method of fabricating a three-dimensional semiconductor memory device according to an embodiment of inventive concepts.

DETAILED DESCRIPTION

Example embodiments of inventive concepts will now be described more fully with reference to the accompanying drawings, in which example embodiments are shown.

Figure 1:
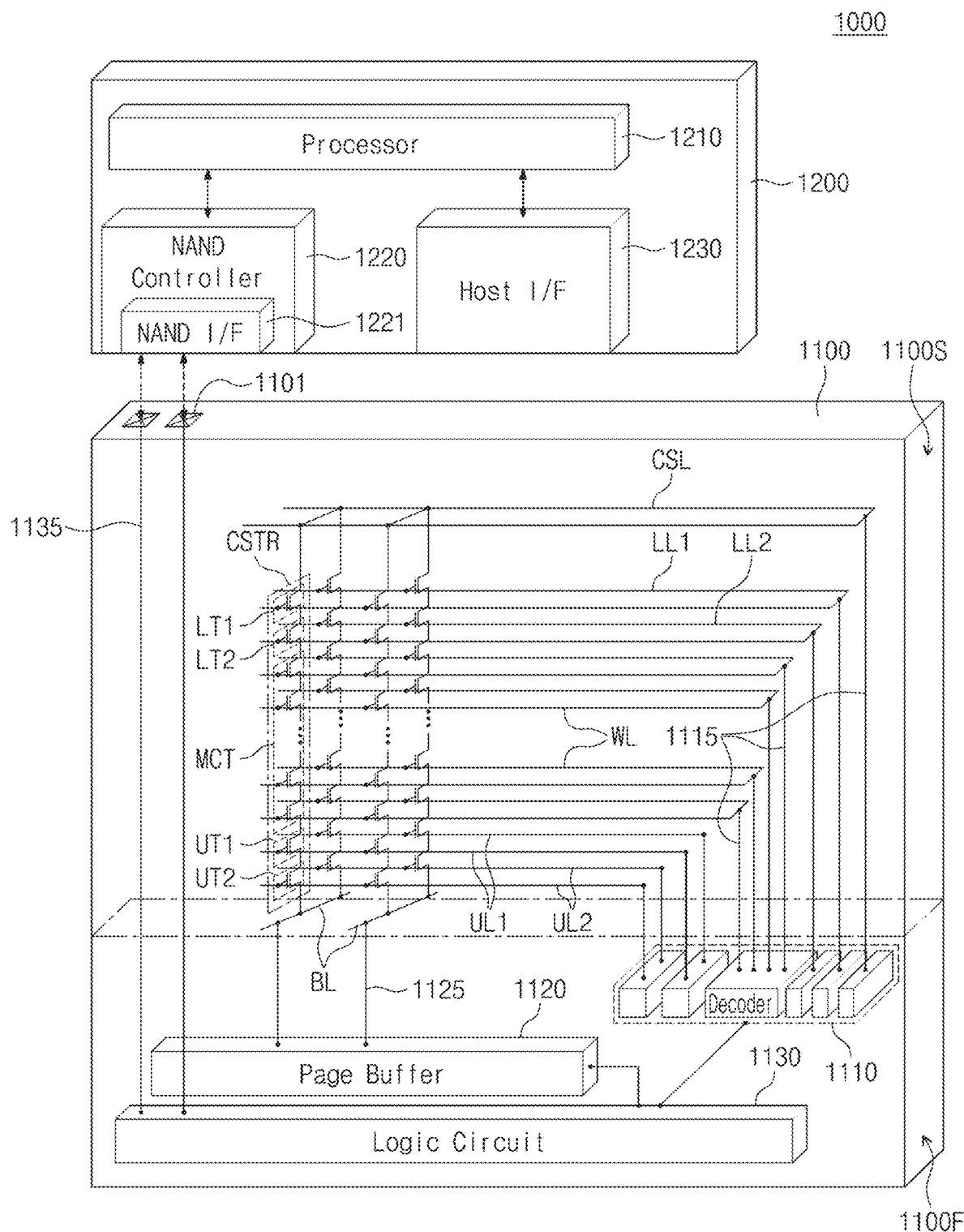
FIG. 1 is a diagram schematically illustrating an electronic system including a three-dimensional semiconductor memory device, according to an embodiment of inventive concepts.

FIG. 1 is a diagram schematically illustrating an electronic system including a three-dimensional semiconductor memory device, according to an embodiment of inventive concepts.

Referring to FIG. 1, an electronic system 1000 may include a three-dimensional semiconductor memory device 1100 and a controller 1200, which is electrically connected to the three-dimensional semiconductor memory device 1100. The electronic system 1000 may be a storage device including one or more three-dimensional semiconductor memory devices 1100 or an electronic device including the storage device. For example, the electronic system 1000 may be a solid state drive (SSD) device, a universal serial bus (USB), a computing system, a medical system, or a communication system, in which at least one three-dimensional semiconductor memory devices 1100 is provided.

The three-dimensional semiconductor memory device 1100 may be a nonvolatile memory device (e.g., a three-dimensional NAND FLASH memory device to be described below). The three-dimensional semiconductor memory device 1100 may include a first region 1100F and a second region 1100S on the first region 1100F. However, unlike the example illustrated in the drawings, the first region 1100F alternatively may be disposed at a side of the second region 1100S. The first region 1100F may be a peripheral circuit region, which includes a decoder circuit 1110, a page buffer 1120, and a logic circuit 1130. The second region 1100S may be a memory cell region, which includes bit lines BL, a common source line CSL, word lines WL, first lines LL1 and LL2, second lines UL1 and UL2, and memory cell strings CSTR between the bit lines BL and the common source line CSL.

In the second region 1100S, each of the memory cell strings CSTR may include first transistors LT1 and LT2 adjacent to the common source line CSL, second transistors UT1 and UT2 adjacent to the bit lines BL, and a plurality of memory cell transistors MCT disposed between the first transistors LT1 and LT2 and the second transistors UT1 and UT2. The number of the first transistors LT1 and LT2 and the number of the second transistors UT1 and UT2 may be variously changed, according to embodiments. The memory cell strings CSTR may be positioned between the common source line CSL and the first region 1100F.

For example, the second transistors UT1 and UT2 may include string selection transistors, and the first transistors LT1 and LT2 may include ground selection transistors. The first lines LL1 and LL2 may serve as gate electrodes of the first transistors LT1 and LT2. The word lines WL may serve as gate electrodes of the memory cell transistors MCT, and the second lines UL1 and UL2 may serve as gate electrodes of the second transistors UT1 and UT2.

For example, the first transistors LT1 and LT2 may include a first erase control transistor LT1 and a ground selection transistor LT2, which are connected in series. For example, the second transistors UT1 and UT2 may include a string selection transistor UT1 and a second erase control transistor UT2, which are connected in series. At least one of the first and second erase control transistors LT1 and UT2 may be used for an erase operation of erasing data, which are stored in the memory cell transistors MCT, using a gate-induced drain leakage (GIDL) phenomenon.

The common source line CSL, the first lines LL1 and LL2, the word lines WL, and the second lines UL1 and UL2 may be electrically connected to the decoder circuit 1110 through first interconnection lines 1115, which are extended from the first region 1100F to the second region 1100S. The bit lines BL may be electrically connected to the page buffer 1120 through second interconnection lines 1125, which are extended from the first region 1100F to the second region 1100S.

In the first region 1100F, the decoder circuit 1110 and the page buffer 1120 may be configured to control a control operation, which is performed on at least one selected one of the memory cell transistors MCT. The decoder circuit 1110 and the page buffer 1120 may be controlled by the logic circuit 1130. The three-dimensional semiconductor memory device 1100 may communicate with the controller 1200 through an input/output pad 1101, which is electrically connected to the logic circuit 1130. The input/output pad 1101 may be electrically connected to the logic circuit 1130 through an input/output interconnection line 1135, which is extended from the first region 1100F to the second region 1100S.

The controller 1200 may include a processor 1210, a NAND controller 1220, and a host interface 1230. In an embodiment, the electronic system 1000 may include a plurality of three-dimensional semiconductor memory devices 1100, and in this case, the controller 1200 may control the three-dimensional semiconductor memory devices 1100.

The processor 1210 may control overall operations of the electronic system 1000 including the controller 1200. Based on a specific firmware, the processor 1210 may execute operations of controlling the NAND controller 1220 and accessing the three-dimensional semiconductor memory device 1100. The NAND controller 1220 may include a NAND interface 1221, which is used for communication with the three-dimensional semiconductor memory device 1100. The NAND interface 1221 may be used to transmit and receive control commands to control the three-dimensional semiconductor memory device 1100, data to be written in or read from the memory cell transistors MCT of the three-dimensional semiconductor memory device 1100, and so forth. The host interface 1230 may be configured to allow for communication between the electronic system 1000 and an external host. If a control command is provided from an external host through the host interface 1230, the processor 1210 may control the semiconductor device 1100 in response to the control command.

Figure 2:
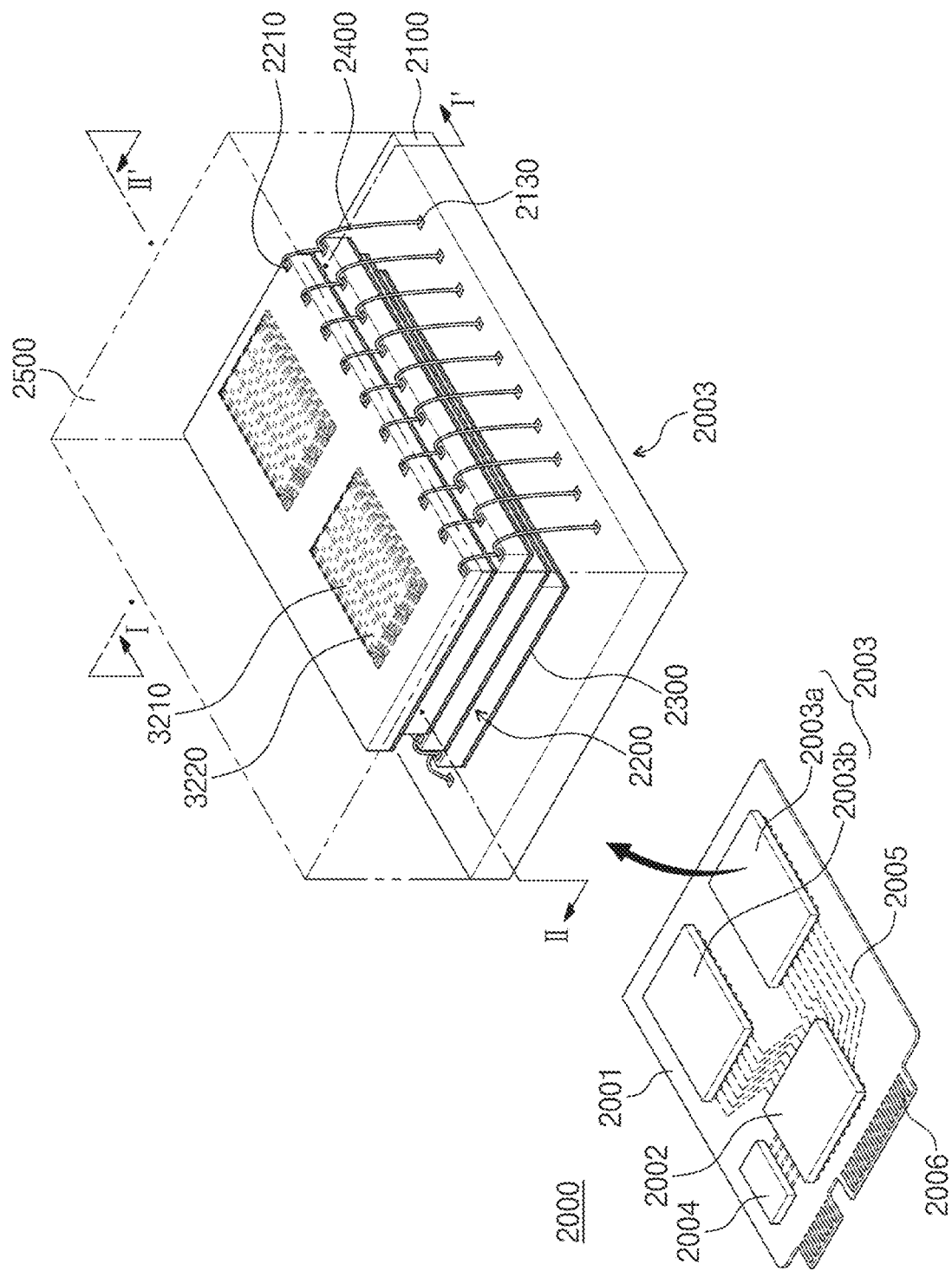
FIG. 2 is a perspective view schematically illustrating an electronic system including a three-dimensional semiconductor memory device, according to an embodiment of inventive concepts.

FIG. 2 is a perspective view schematically illustrating an electronic system including a three-dimensional semiconductor memory device, according to an embodiment of inventive concepts.

Referring to FIG. 2, an electronic system 2000 may include a main substrate 2001 and a controller 2002, one or more semiconductor packages 2003, and a DRAM 2004, which are mounted on the main substrate 2001. The semiconductor package 2003 and the DRAM 2004 may be connected to the controller 2002 and to each other by interconnection patterns 2005, which are provided in the main substrate 2001.

The main substrate 2001 may include a connector 2006, which includes a plurality of pins coupled to an external host. In the connector 2006, the number and the arrangement of the pins may be changed depending on a communication interface between the electronic system 2000 and an external host. For example, the electronic system 2000 may communicate with the external host, in accordance with one of interfaces, such as universal serial bus (USB), peripheral component interconnect express (PCI-Express), serial advanced technology attachment (SATA), universal flash storage (UFS) M-PHY, or the like. In an embodiment, the electronic system 2000 may be driven by an electric power, which is supplied from the external host through the connector 2006. The electronic system 2000 may further include a power management integrated circuit (PMIC) of separately supplying the electric power, which is provided from the external host, to the controller 2002 and the semiconductor package 2003.

The controller 2002 may control a writing or reading operation on the semiconductor package 2003 and may improve an operation speed of the electronic system 2000.

The DRAM 2004 may be a buffer memory, which relieves technical difficulties caused by a difference in speed between the semiconductor package 2003, which serves as a data storage device, and an external host. In an embodiment, the DRAM 2004 in the electronic system 2000 may serve as a cache memory and may provide a storage space, in which data can be temporarily stored when a control operation is executed on the semiconductor package 2003. In the case where the electronic system 2000 includes the DRAM 2004, the controller 2002 may further include a DRAM controller that is used to control the DRAM 2004, in addition to a NAND controller that is used to control the semiconductor package 2003.

The semiconductor package 2003 may include first and second semiconductor packages 2003a and 2003b, which are spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, the semiconductor chips 2200, which are provided on the package substrate 2100, adhesive layers 2300, which are respectively disposed in bottom surfaces of the semiconductor chips 2200, connection structures 2400, which are used to electrically connect the semiconductor chips 2200 to the package substrate 2100, and a molding layer 2500, which is provided on the package substrate 2100 to cover the semiconductor chips 2200 and the connection structures 2400.

The package substrate 2100 may be a printed circuit board including package upper pads 2130. Each of the semiconductor chips 2200 may include input/output pads 2210. Each of the input/output pads 2210 may correspond to the input/output pad 1101 of FIG. 1. Each of the semiconductor chips 2200 may include gate stacks 3210 and memory channel structures 3220. Each of the semiconductor chips 2200 may include a three-dimensional semiconductor memory device, which will be described below.

The connection structures 2400 may be, for example, bonding wires, which are provided to electrically connect the input/output pads 2210 to the package upper pads 2130. That is, in each of the first and second semiconductor packages 2003a and 2003b, the semiconductor chips 2200 may be electrically connected to each other in a bonding wire manner and may be electrically connected to the package upper pads 2130 of the package substrate 2100. In an embodiment, the semiconductor chips 2200 in each of the first and second semiconductor packages 2003a and 2003b may be electrically connected to each other by through silicon vias (TSVs), not by the connection structure 2400 provided in the form of bonding wires.

Unlike the example illustrated in FIG. 2, the controller 2002 and the semiconductor chips 2200 may be included in a single package. In an embodiment, the controller 2002 and the semiconductor chips 2200 may be mounted on a separate interposer substrate, not on the main substrate 2001, and may be connected to each other through interconnection lines, which are provided in the interposer substrate.

Figure 3:
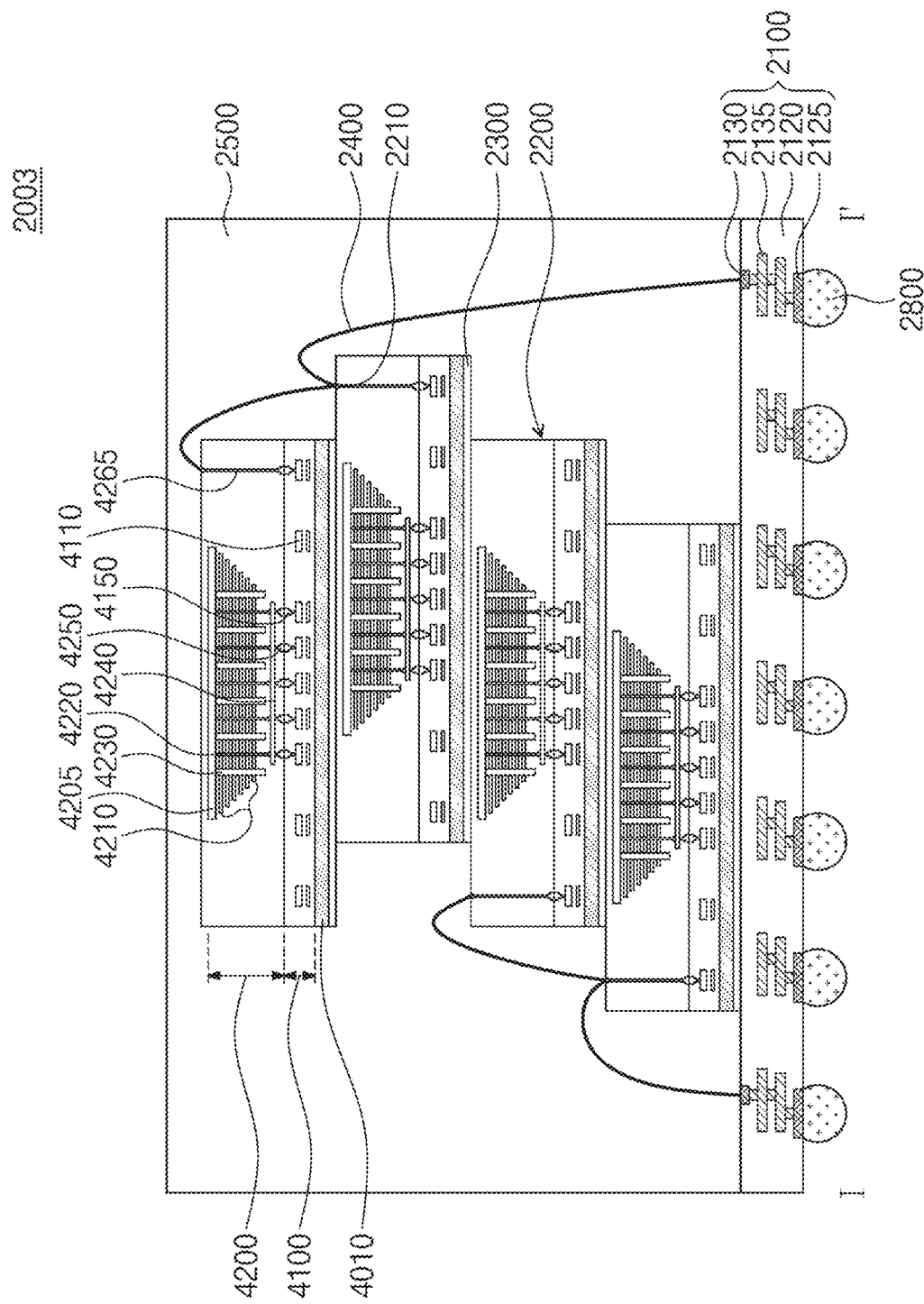
FIGS. 3 and 4 are sectional views, which are respectively taken along lines I-I' and II-II' of FIG. 2 to illustrate a semiconductor package including a three-dimensional semiconductor memory device, according to an embodiment of inventive concepts.
Figure 4:
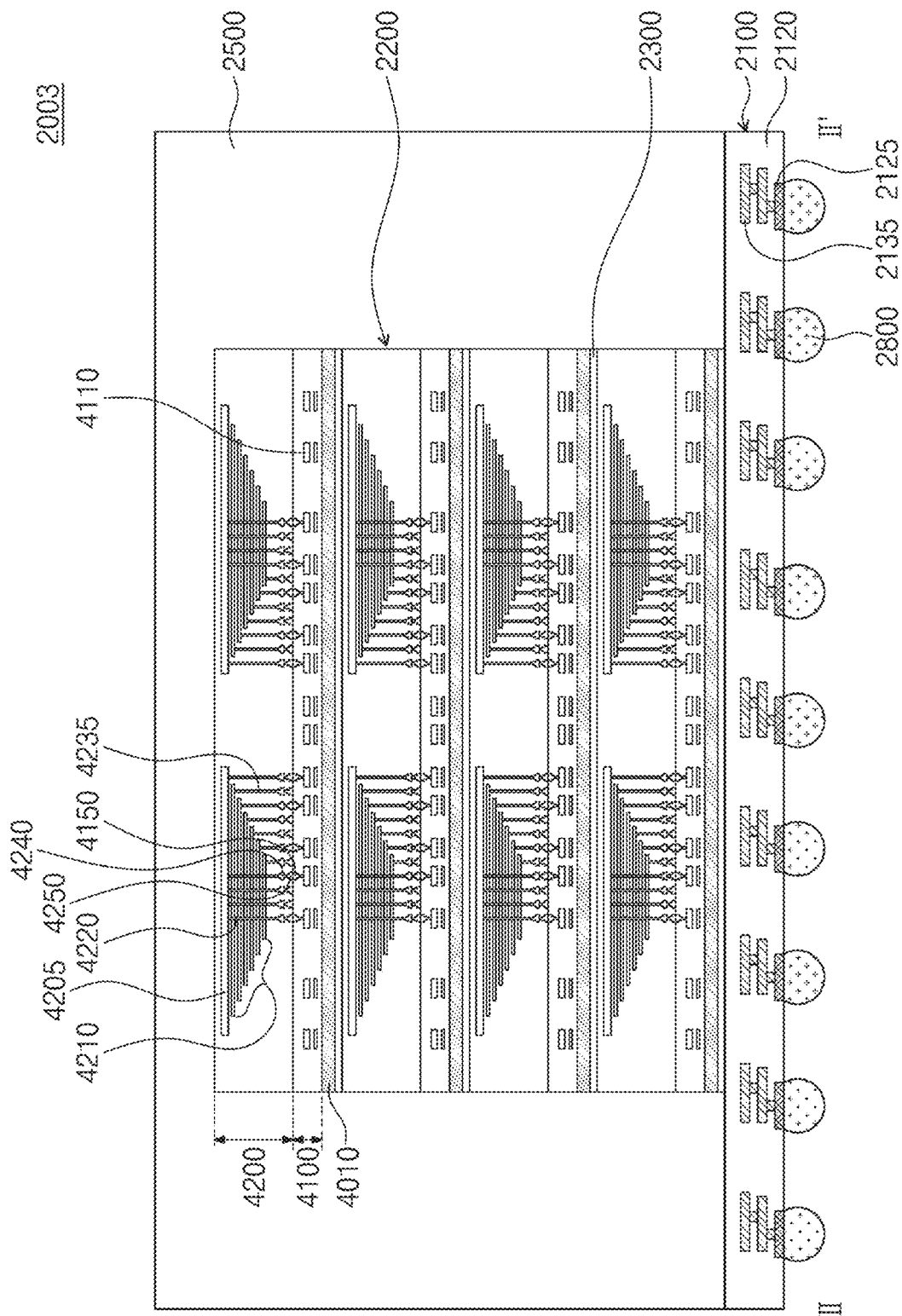

FIGS. 3 and 4 are sectional views, which are respectively taken along lines I-I' and II-II' of FIG. 2 to illustrate a semiconductor package including a three-dimensional semiconductor memory device, according to an embodiment of inventive concepts.

Referring to FIGS. 3 and 4, the semiconductor package 2003 may include the package substrate 2100, the semiconductor chips 2200 on the package substrate 2100, and the molding layer 2500 covering the package substrate 2100 and the semiconductor chips 2200.

The package substrate 2100 may include a package substrate body portion 2120, upper pads 2130, which are provided on a top surface of the package substrate body portion 2120 and are exposed to the outside of the package substrate body portion 2120 near the top surface, lower pads 2125, which are provided on a bottom surface of the package substrate body portion 2120 or are exposed to the outside of the package substrate body portion 2120 near the bottom surface, and internal lines 2135, which are provided in the package substrate body portion 2120 to electrically connect the upper pads 2130 to the lower pads 2125. The upper pads 2130 may be electrically connected to the connection structures 2400. The lower pads 2125 may be connected to the interconnection patterns 2005 of the main substrate 2001 of the electronic system 2000, which is shown in FIG. 2, through conductive connecting portions 2800.

Referring to FIGS. 2 and 3, the semiconductor chips 2200 may be provided such that some of side surfaces are not aligned to each other and the others are aligned to each other. The semiconductor chips 2200 may be electrically connected to each other through the connection structures 2400, which are provided in the form of bonding wires. Each of the semiconductor chips 2200 may include substantially the same elements.

Each of the semiconductor chips 2200 may include a semiconductor substrate 4010, a first structure 4100 on the semiconductor substrate 4010, and a second structure 4200 on the first structure 4100. The second structure 4200 may be connected to the first structure 4100 in a wafer bonding manner.

The first structure 4100 may include peripheral circuit interconnection lines 4110 and first bonding pads 4150. The second structure 4200 may include a common source line 4205, a gate stack 4210, which is provided between the common source line 4205 and the first structure 4100, memory channel structures 4220 and separation structures 4230, which are provided to penetrate the gate stack 4210, and second bonding pads 4250, which are respectively connected to the memory channel structures 4220 and the word lines WL (e.g., see FIG. 1) of the gate stack 4210. For example, the second bonding pads 4250 may be electrically connected to the memory channel structures 4220 and the word lines WL, respectively, through bit lines 4240, which are electrically connected to the memory channel structures 4220, and gate interconnection lines 4235, which are electrically connected to the word lines WL. The first bonding pads 4150 of the first structure 4100 and the second bonding pads 4250 of the second structure 4200 may be in contact with each other and may be coupled to each other. The coupling portions between the first bonding pads 4150 and the second bonding pads 4250 may be formed of or include, for example, copper (Cu).

Each of the semiconductor chips 2200 may further include the input/output pad 2210 and an input/output interconnection line 4265 below the input/output pad 2210. The input/output interconnection line 4265 may be electrically connected to some of the second bonding pads 4250 and some of the peripheral circuit interconnection lines 4110.

Figure 5:
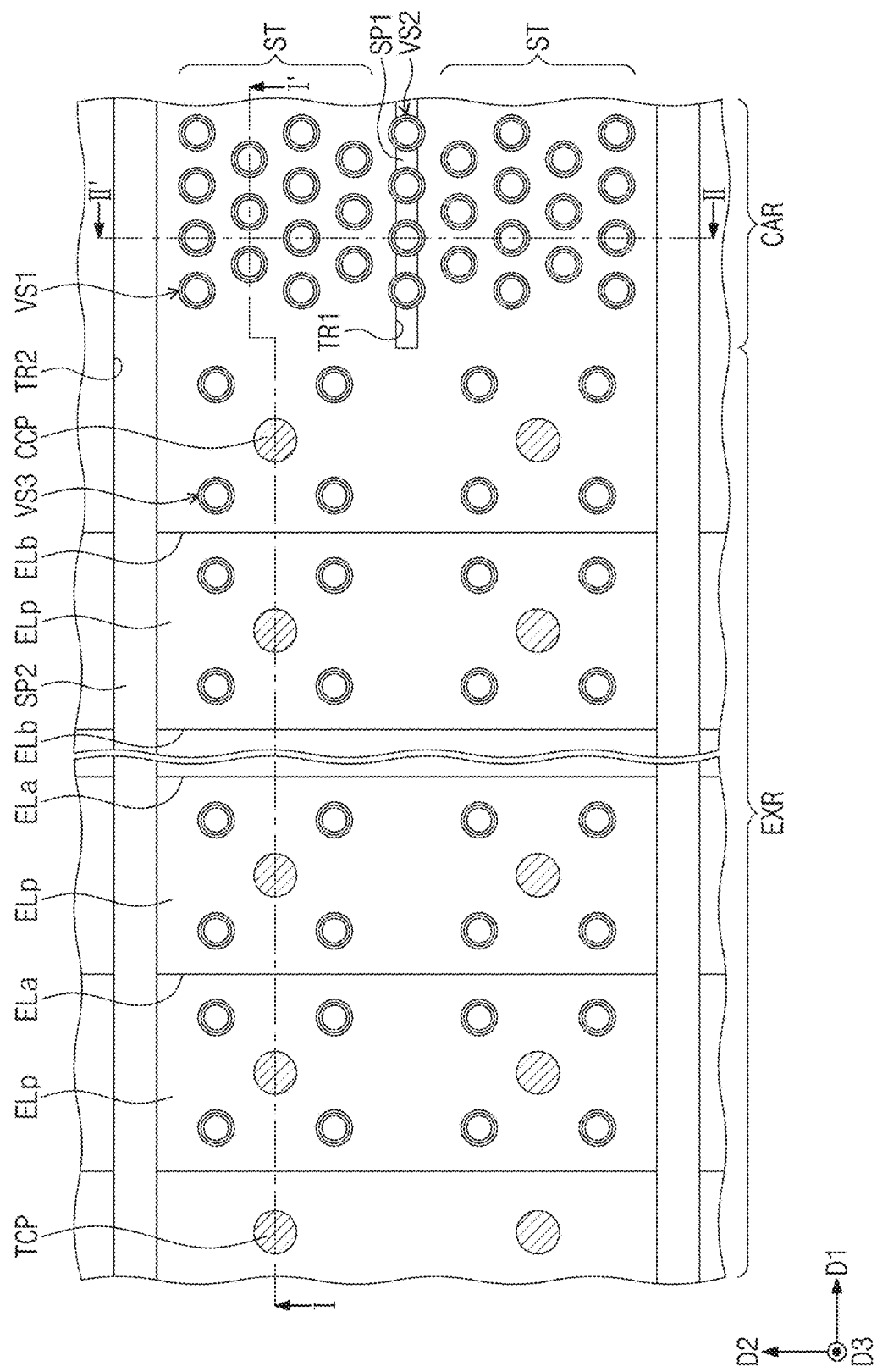
FIG. 5 is a plan view illustrating a three-dimensional semiconductor memory device according to an embodiment of inventive concepts.
Figure 6A:
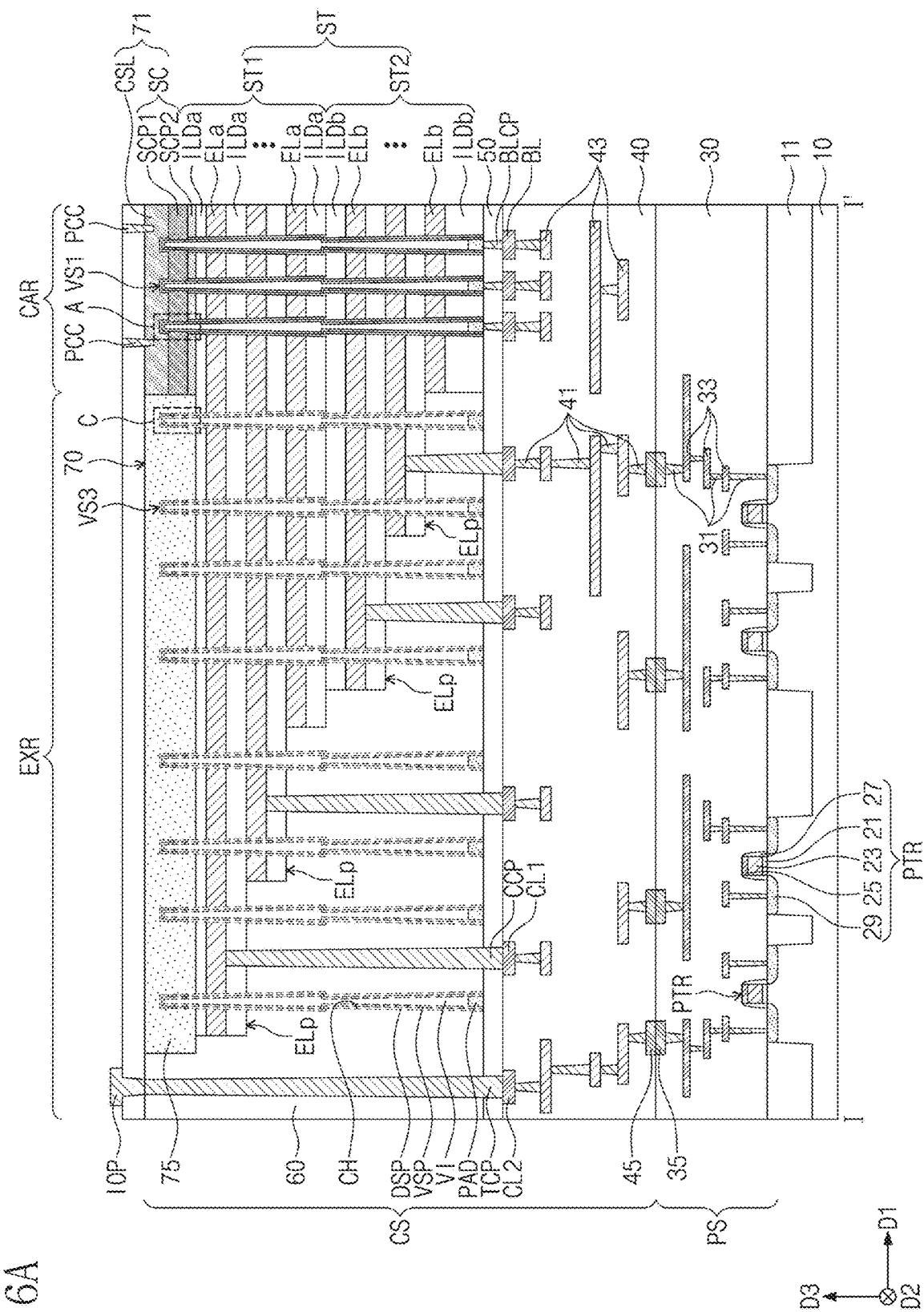
FIGS. 6A and 6B are sectional views, which are respectively taken along lines I-I' and II-II' of FIG. 5 to illustrate a three-dimensional semiconductor memory device according to an embodiment of inventive concepts.
Figure 6B:
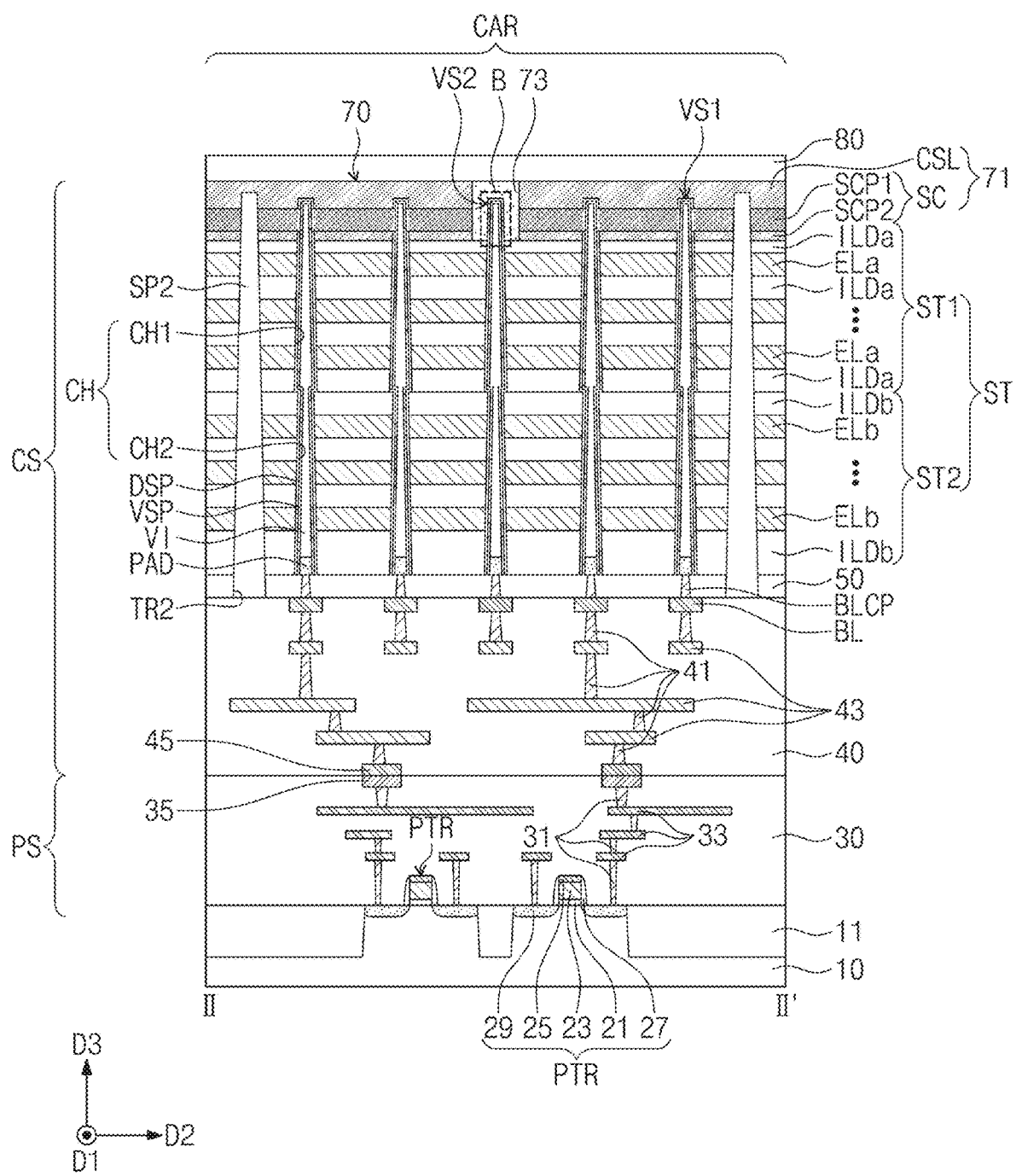

FIG. 5 is a plan view illustrating a three-dimensional semiconductor memory device according to an embodiment of inventive concepts. FIGS. 6A and 6B are sectional views, which are respectively taken along lines I-I' and II-II' of FIG. 5 to illustrate a three-dimensional semiconductor memory device according to an embodiment of inventive concepts.

Referring to FIGS. 5, 6A, and 6B, a three-dimensional semiconductor memory device according to an embodiment of inventive concepts may include a first substrate 10, a peripheral circuit structure PS on the first substrate 10, and a cell array structure CS on the peripheral circuit structure PS. The first substrate 10, the peripheral circuit structure PS, and the cell array structure CS may correspond to the semiconductor substrate 4010, the first structure 4100 on the semiconductor substrate 4010, and the second structure 4200 on the first structure 4100, respectively, described with reference to FIGS. 3 and 4.

According to an embodiment of inventive concepts, the cell array structure CS may be provided on and coupled to the peripheral circuit structure PS, and in this case, the three-dimensional semiconductor memory device may have an increased storage capacity per unit area. In addition, the peripheral circuit structure PS and the cell array structure CS may be separately fabricated and then may be coupled to each other, and in this case, it may be possible to limit and/or prevent peripheral transistors PTR from being damaged by several thermal treatment processes. Accordingly, the electrical characteristics and reliability of the three-dimensional semiconductor memory device may be improved.

In an embodiment, the first substrate 10 may be a silicon substrate, a silicon-germanium substrate, a germanium substrate, or a structure including a single-crystalline silicon substrate and a single crystalline epitaxial layer grown therefrom. The first substrate 10 may have a top surface that is parallel to two different directions (e.g., a first direction D1 and a second direction D2) and is perpendicular to a third direction D3. For example, the first to third directions D1, D2, and D3 may be orthogonal to each other. A device isolation layer 11 may be provided in the first substrate 10. The device isolation layer 11 may define an active region of the first substrate 10.

The first substrate 10 may include a cell array region CAR and a cell array contact region EXR. The cell array contact region EXR may extend from the cell array region CAR in the first direction D1 (or an opposite direction of the first direction D1).

The peripheral circuit structure PS may be provided on the first substrate 10, and in an embodiment, the peripheral circuit structure PS may include the peripheral transistors PTR, which are provided on the first substrate 10, peripheral contact plugs 31, which are coupled to the peripheral transistors PTR, peripheral circuit interconnection lines 33, which are electrically connected to the peripheral transistors PTR through the peripheral contact plugs 31, first bonding pads 35, which are electrically connected to the peripheral circuit interconnection lines 33, and a first insulating layer 30, which is provided to enclose them. The peripheral transistors PTR may be provided on the active region of the first substrate 10. The peripheral circuit interconnection lines 33 may correspond to the peripheral circuit interconnection lines 4110 of FIGS. 3 and 4, and the first bonding pads 35 may correspond to the first bonding pads 4150 of FIGS. 3 and 4.

In an embodiment, widths of the peripheral contact plugs 31 measured in the first or second direction D1 or D2 may increase in the third direction D3. The peripheral contact plugs 31 and the peripheral circuit interconnection lines 33 may be formed of or include at least one of conductive materials (e.g., metallic materials).

In an embodiment, the peripheral transistors PTR may constitute at least one of the decoder circuit 1110, the page buffer 1120, and the logic circuit 1130 of FIG. 1. Each of the peripheral transistors PTR may include a peripheral gate insulating layer 21, a peripheral gate electrode 23, a peripheral capping pattern 25, a peripheral gate spacer 27, and peripheral source/drain regions 29. The peripheral gate insulating layer 21 may be provided between the peripheral gate electrode 23 and the first substrate 10. The peripheral capping pattern 25 may be provided on the peripheral gate electrode 23. The peripheral gate spacer 27 may cover side surfaces of the peripheral gate insulating layer 21, the peripheral gate electrode 23, and the peripheral capping pattern 25. The peripheral source/drain regions 29 may be provided in portions of the first substrate 10, which are located at both sides of the peripheral gate electrode 23. The peripheral circuit interconnection lines 33 and the first bonding pads 35 may be electrically connected to the peripheral transistors PTR through the peripheral contact plugs 31. Each of the peripheral transistors PTR may be an NMOS transistor or a PMOS transistor and, in an embodiment, it may be a gate-all-around type transistor.

The first insulating layer 30 may be provided on the first substrate 10. The first insulating layer 30 may be provided on the first substrate 10 to cover the peripheral transistors PTR, the peripheral contact plugs 31, and the peripheral circuit interconnection lines 33. The first insulating layer 30 may be a multi-layered structure including a plurality of insulating layers. For example, the first insulating layer 30 may be formed of or include at least one of silicon oxide, silicon nitride, silicon oxynitride, and/or low-k dielectric materials. The first insulating layer 30 may not cover top surfaces of the first bonding pads 35. The first insulating layer 30 may have a top surface that is substantially coplanar with the top surfaces of the first bonding pads 35.

The cell array structure CS may be provided on the peripheral circuit structure PS, and in an embodiment, the cell array structure CS may include second bonding pads 45, bit lines BL, a stack ST, and a common source region CSL. The second bonding pads 45, the bit lines BL, the stack ST, and the common source region CSL may correspond to the second bonding pads 4250, the bit lines 4240, the gate stack 4210, and the common source line 4205 of FIGS. 3 and 4, respectively.

A second insulating layer 40, connection contact plugs 41, connection circuit interconnection lines 43, and the second bonding pads 45 may be provided on the first insulating layer 30. The second bonding pads 45 may be in contact with the first bonding pads 35 of the peripheral circuit structure PS, and the connection circuit interconnection lines 43 may be electrically connected to the second bonding pads 45 through the connection contact plugs 41. The second insulating layer 40 may be provided to enclose the connection contact plugs 41, the connection circuit interconnection lines 43, and the second bonding pads 45.

The second insulating layer 40 may be a multi-layered structure including a plurality of insulating layers. For example, the second insulating layer 40 may be formed of or include at least one of silicon oxide, silicon nitride, silicon oxynitride, and/or low-k dielectric materials.

In an embodiment, widths of the connection contact plugs 41 measured in the first or second direction D1 or D2 may decrease in the third direction D3. The connection contact plugs 41 and the connection circuit interconnection lines 43 may be formed of or include at least one of conductive materials (e.g., metallic materials).

The second insulating layer 40 may not cover bottom surfaces of the second bonding pads 45. A bottom surface of the second insulating layer 40 may be substantially coplanar with the bottom surfaces of the second bonding pads 45. The bottom surface of each of the second bonding pads 45 may be in direct contact with the top surface of a corresponding one of the first bonding pads 35. The first and second bonding pads 35 and 45 may be formed of or include at least one of metallic materials (e.g., copper (Cu), tungsten (W), aluminum (Al), nickel (Ni), or tin (Sn)). For example, the first and second bonding pads 35 and 45 may be formed of or include copper (Cu). The first and second bonding pads 35 and 45 may be integrally bonded to each other without any interface therebetween to form a single object. The side surfaces of the first and second bonding pads 35 and 45 are illustrated to be aligned to each other, but inventive concepts are not limited to this example. For example, the side surfaces of the first and second bonding pads 35 and 45 may be spaced apart from each other, when viewed in a plan view.

Bit lines BL and first and second conductive lines CL1 and CL2, which are in contact with the connection contact plugs 41, may be provided in an upper portion of the second insulating layer 40. In an embodiment, the bit lines BL and the first and second conductive lines CL1 and CL2 may be extended in the second direction D2 and may be spaced apart from each other in the first direction D1. The bit lines BL and the first and second conductive lines CL1 and CL2 may be formed of or include at least one of conductive materials (e.g., metallic materials).

A third insulating layer 50 may be provided on the second insulating layer 40. A fourth insulating layer 60 and the stack ST, which is enclosed by the fourth insulating layer 60, may be provided on the third insulating layer 50. The third and fourth insulating layers 50 and 60 may be a multi-layered structure including a plurality of insulating layers. For example, the third and fourth insulating layers 50 and 60 may be formed of or include at least one of silicon oxide, silicon nitride, silicon oxynitride, and/or low-k dielectric materials.

Bit line contact plugs BLCP may be provided in the third insulating layer 50. The bit line contact plugs BLCP may be extended in the third direction D3 to connect the bit lines BL to first vertical channel structures VS1, which will be described below.

Cell contact plugs CCP and a penetration contact plug TCP may be provided to penetrate the third insulating layer 50 and the fourth insulating layer 60. The cell contact plugs CCP may be extended in the third direction D3 to connect the first conductive lines CL1 to gate electrodes ELa and ELb of the stack ST, which will be described below. Each of the cell contact plugs CCP may be provided to penetrate one of interlayer dielectric layers ILDa and ILDb of the stack ST, which will be described below. The penetration contact plug TCP may be extended in the third direction D3 to connect the second conductive line CL2 to an input/output pad TOP, which will be described below.

The bit line contact plugs BLCP, the cell contact plugs CCP, and the penetration contact plug TCP may be spaced apart from each other in the first direction D1. In the bit line contact plugs BLCP, the cell contact plugs CCP, and the penetration contact plug TCP, a width measured in the first or second direction D1 or D2 may decrease in the third direction D3. The bit line contact plugs BLCP, the cell contact plugs CCP, and the penetration contact plug TCP may be formed of or include at least one of conductive materials (e.g., metallic materials).

The stack ST may be provided on the third insulating layer 50. The stack ST may be enclosed by the fourth insulating layer 60. A bottom surface of the stack ST (e.g., in contact with the third insulating layer 50) may be substantially coplanar with a bottom surface of the fourth insulating layer 60.

In an embodiment, a plurality of the stacks ST may be provided. The stacks ST may be extended in the first direction D1 and may be spaced apart from each other in the second direction D2, when viewed in the plan view of FIG. 5. Hereinafter, just one stack ST will be described, for brevity's sake, but the others of the stacks ST may also have substantially the same features as described below.

The stack ST may include a first stack ST1 and a second stack ST2. The first stack ST1 may include first interlayer dielectric layers ILDa and first gate electrodes ELa, which are alternately and repeatedly stacked, and the second stack ST2 may include second interlayer dielectric layers ILDb and second gate electrodes ELb, which are alternately and repeatedly stacked.

The second stack ST2 may be provided between the first stack ST1 and the first substrate 10. More specifically, the second stack ST2 may be provided on a bottom surface of the bottommost one of the first interlayer dielectric layers ILDa of the first stack ST1. The topmost one of the second interlayer dielectric layers ILDb of the second stack ST2 may be in contact with the bottommost one of the first interlayer dielectric layers ILDa of the first stack ST1, but inventive concepts are not limited to this example. For example, at least one insulating layer may be provided between the topmost one of the second gate electrodes ELb of the second stack ST2 and the first gate electrodes ELa of the first stack ST1.

The first and second gate electrodes ELa and ELb may be formed of or include at least one of, for example, doped semiconductors (e.g., doped silicon and so forth), metals (e.g., tungsten, copper, aluminum, and so forth), conductive metal nitrides (e.g., titanium nitride, tantalum nitride, and so forth), or transition metals (e.g., titanium, tantalum, and so forth). The first and second interlayer dielectric layers ILDa and ILDb may be formed of or include at least one of silicon oxide, silicon nitride, silicon oxynitride, and/or low-k dielectric materials. For example, the first and second interlayer dielectric layers ILDa and ILDb may be formed of or include high density plasma (HDP) oxide or tetraethylorthosilicate (TEOS).

On the cell array contact region EXR, a thickness of each of the first and second stacks ST1 and ST2 in the third direction D3 may decrease with increasing distance from the outermost one of the first vertical channel structures VS1, which will be described below. In other words, each of the first and second stacks ST1 and ST2 may have a staircase structure in the first direction D1.

Lengths of the first gate electrodes ELa of the first stack ST1 and the second gate electrodes ELb of the second stack ST2 in the first direction D1 may increase with increasing distance from the first substrate 10. Side surfaces of the first and second gate electrodes ELa and ELb may be spaced apart from each other by a specific distance in the first direction D1, when viewed in the plan view of FIG. 5. The bottommost one of the second gate electrodes ELb of the second stack ST2 may have the smallest length in the first direction D1, and the topmost one of the first gate electrodes ELa of the first stack ST1 may have the largest length in the first direction D1.

The first and second gate electrodes ELa and ELb may include pad portions ELp, which are provided on the cell array contact region EXR. The pad portions ELp may be disposed at positions that are different from each other in horizontal and vertical directions. The pad portions ELp may form the staircase structure in the first direction D1. Each of the cell contact plugs CCP may penetrate a corresponding one of the first and second interlayer dielectric layers ILDa and ILDb and may be in contact with the pad portion ELp of a corresponding one of the first and second gate electrodes ELa and ELb.

The first and second interlayer dielectric layers ILDa and ILDb may be provided between the first and second gate electrodes ELa and ELb and may have side surfaces that are aligned to side surfaces of the first and second gate electrodes ELa and ELb thereon. That is, similar to the first and second gate electrodes ELa and ELb, lengths of the first and second interlayer dielectric layers ILDa and ILDb in the first direction D1 may increase with increasing distance from the first substrate 10. In thicknesses measured in the third direction D3, the bottommost one of the second interlayer dielectric layers ILDb may be the thickest and the topmost one of the first interlayer dielectric layers ILDa may be thinner than the others of the interlayer dielectric layers, but inventive concepts are not limited to this example.

Vertical channel holes CH may be formed on the cell array region CAR to penetrate the stack ST in the third direction D3, and the first vertical channel structures VS1 and second vertical channel structures VS2 may be provided in the vertical channel holes CH. The first vertical channel structures VS1 may correspond to the memory channel structures 4220 of FIGS. 3 and 4.

The vertical channel holes CH may also be formed on the cell array contact region EXR to penetrate at least a portion of the stack ST and the fourth insulating layer 60 in the third direction D3, and third vertical channel structures VS3 may be provided in the vertical channel holes CH, which are formed on the cell array contact region EXR.

The vertical channel holes CH may include first vertical channel holes CH1 and second vertical channel holes CH2, which are connected to the first vertical channel holes CH1. Widths of the first and second vertical channel holes CH1 and CH2 measured in the first or second direction D1 or D2 may decrease with increasing distance from the first substrate 10. The first and second vertical channel holes CH1 and CH2 may have different diameters from each other near a boundary region, where the first and second vertical channel holes CH1 and CH2 are connected to each other. In detail, an upper diameter of each of the second vertical channel holes CH2 may be smaller than a lower diameter of a corresponding one of the first vertical channel holes CH1. The first and second vertical channel holes CH1 and CH2 may form a stepwise structure near the boundary region. However, inventive concepts are not limited to this example, and in an embodiment, the first to third vertical channel structures VS1, VS2, and VS3 may be provided in three or more vertical channel holes CH, which are provided to form stepwise structures at two or more different levels, or may be provided in the vertical channel holes CH whose side surfaces are substantially flat without such a stepwise structure.

Each of the first to third vertical channel structures VS1, VS2, and VS3 may include a conductive pad PAD, which is adjacent to the third insulating layer 50, a data storage pattern DSP, which is provided to conformally cover an inner side surface of each of the first and second vertical channel holes CH1 and CH2, a vertical semiconductor pattern VSP, which is provided to conformally cover a side surface of the data storage pattern DSP, and a gap-fill insulating pattern VI, which is provided to fill an internal space of each of the first and second vertical channel holes CH1 and CH2 enclosed by the vertical semiconductor pattern VSP and the conductive pad PAD. The vertical semiconductor pattern VSP may be surrounded by the data storage pattern DSP. In an embodiment, each of the first to third vertical channel structures VS1, VS2, and VS3 may have a circular, elliptical, or bar-shaped bottom surface.

The vertical semiconductor pattern VSP may be provided between the data storage pattern DSP and the gap-fill insulating pattern VI and between the data storage pattern DSP and the conductive pad PAD. The vertical semiconductor pattern VSP may have a top-closed pipe or macaroni structure. The data storage pattern DSP may have a top-opened pipe or macaroni structure. The vertical semiconductor pattern VSP may be formed of or include at least one of doped semiconductor materials or undoped or intrinsic semiconductor materials and may have a poly-crystalline or single-crystalline structure. The conductive pad PAD may be formed of or include at least one of doped semiconductor materials or conductive materials.

When viewed in the plan view of FIG. 5, a first trench TR1 and a second trench TR2 may be provided to extend in the first direction D1 and to cross the stack ST. The first trench TR1 may be provided in the cell array region CAR, and the second trench TR2 may be extended from the cell array region CAR toward the cell array contact region EXR. A width of each of the first and second trenches TR1 and TR2 in the first or second direction D1 or D2 may decrease with increasing distance from the first substrate 10.

A first separation pattern SP1 and a second separation pattern SP2 may be provided to fill the first and second trenches TR1 and TR2, respectively. The first and second separation patterns SP1 and SP2 may correspond to the separation structures 4230 of FIGS. 3 and 4. A length of the second separation pattern SP2 in the first direction D1 may be larger than a length of the first separation pattern SP1 in the first direction D1. Side surfaces of the first and second separation patterns SP1 and SP2 may be in contact with at least a portion of the first and second gate electrodes ELa and ELb and the first and second interlayer dielectric layers ILDa and ILDb of the stack ST. In an embodiment, the first and second separation patterns SP1 and SP2 may be formed of or include at least one of oxide materials (e.g., silicon oxide).

A bottom surface of the second separation pattern SP2 may be substantially coplanar with the bottom surface of the third insulating layer 50 (e.g., the top surface of the second insulating layer 40) and the top surfaces of the bit lines BL and the first and second conductive lines CL1 and CL2. A top surface of the second separation pattern SP2 may be located at a level that is higher than the top surfaces of the first to third vertical channel structures VS1, VS2, and VS3, but inventive concepts are not limited to this example.

In the case where a plurality of the stacks ST are provided, the first separation pattern SP1 or the second separation pattern SP2 may be provided between the stacks ST that are arranged in the second direction D2. For example, the stacks ST may be spaced apart from each other in the second direction D2 with the first or second separation pattern SP1 or SP2 interposed therebetween.

A second substrate 70 may be provided on the stack ST. The second substrate 70 may include a first portion 71 and a second portion 73, which are provided on the cell array region CAR, and a third portion 75, which are provided on the cell array contact region EXR.

The first portion 71 of the second substrate 70 may be in contact with a lower portion of each of the first vertical channel structures VS1. The first vertical channel structures VS1 may be provided to penetrate at least a portion of the first portion 71 of the second substrate 70.

The first portion 71 of the second substrate 70 may be an impurity region that is doped to have a first conductivity type (e.g., n-type). The first portion 71 of the second substrate 70 may include the common source region CSL on the stack ST and a source structure SC between the stack ST and the common source region CSL. The common source region CSL and the source structure SC may be extended in the first and second directions D1 and D2 or parallel to the top surface of the first substrate 10 (or the top surface of the stack ST). The common source region CSL may be a plate-shape pattern that is extended parallel to the top surface of the first substrate 10.

In an embodiment, the common source region CSL may be formed of or include a doped polycrystalline semiconductor material or a single crystalline semiconductor material.

The source structure SC may include a first source conductive pattern SCP1 on the stack ST and a second source conductive pattern SCP2 between the stack ST and the first source conductive pattern SCP1. The second source conductive pattern SCP2 may be provided between the first source conductive pattern SCP1 and the topmost one of the first interlayer dielectric layers ILDa of the first stack ST1. The second source conductive pattern SCP2 may be in direct contact with the first source conductive pattern SCP1. A thickness of the first source conductive pattern SCP1 in the third direction D3 may be larger than a thickness of the second source conductive pattern SCP2 in the third direction D3. The source structure SC may be formed of or include at least one of doped semiconductor materials. For example, the source structure SC may be formed of or include a semiconductor material that is doped to have the same conductivity type of the common source region CSL. In an embodiment, an impurity concentration of the first source conductive pattern SCP1 may be higher than an impurity concentration of the second source conductive pattern SCP2 and an impurity concentration of the common source region CSL.

The second portion 73 of the second substrate 70 may be overlapped with the first separation pattern SP1 in the third direction D3 and may be in contact with a lower portion of each of the second vertical channel structures VS2. The second vertical channel structures VS2 may be provided to penetrate at least a portion of the second portion 73 of the second substrate 70. The lower portion of each of the second vertical channel structures VS2 may be enclosed by the second portion 73 of the second substrate 70 and may be spaced apart from the first portion 71 of the second substrate 70.

The third portion 75 of the second substrate 70 may be overlapped with the staircase structure of the stack ST (e.g., the pad portions ELp of the first and second gate electrodes ELa and ELb) in the third direction D3 and may be in contact with a lower portion of each of the third vertical channel structures VS3. The third vertical channel structures VS3 may be provided to penetrate at least a portion of the third portion 75 of the second substrate 70. The lower portion of each of the third vertical channel structures VS3 may be enclosed by the third portion 75 of the second substrate 70 and may be spaced apart from the first portion 71 of the second substrate 70.

The second and third portions 73 and 75 of the second substrate 70 may be impurity regions, which are doped to have a second conductivity type (e.g., p-type) different from the first portion 71 of the second substrate 70. During an erase operation, a reverse junction may be formed between the first portion 71 and the second portion 73 and between the first portion 71 and the third portion 75, and the second vertical channel structures VS2 and the third vertical channel structures VS3, which are in contact with the second portion 73 and the third portion 75, respectively, may be in an electrically floated state. Since, during the erase operation, the second and third vertical channel structures VS2 and VS3 are in the electrically floated state, it may be possible to reduce a failure rate in the erase operation, and thus, the electrical characteristics and reliability of the three-dimensional semiconductor memory device may be improved.

A fifth insulating layer 80 may be provided on the second substrate 70 and the fourth insulating layer 60. The input/output pad TOP may be provided to penetrate the fifth insulating layer 80 and to be connected to the penetration contact plug TCP.

The input/output pad TOP may be electrically connected to the second conductive line CL2 through the penetration contact plug TCP and moreover may be electrically connected to at least one of the peripheral transistors PTR of the peripheral circuit structure PS. A portion of the input/output pad TOP may protrude above the top surface of the fifth insulating layer 80, but inventive concepts are not limited to this example. The input/output pad TOP may correspond to one of the input/output pad 1101 of FIG. 1 or the input/output pads 2210 of FIGS. 3 and 4.

Common source contacts PCC may be provided to penetrate the fifth insulating layer 80 and a portion of the second substrate 70. A bottom surface of the common source contacts PCC may be located at a level lower than the top surface of the second substrate 70. The common source contacts PCC may be electrically connected to the common source region CSL. Although not shown, additional interconnection lines or contacts may be further provided on the common source contacts PCC.

Widths of the input/output pad TOP and the common source contacts PCC measured in the first or second direction D1 or D2 may increase in the third direction D3. The input/output pad TOP and the common source contacts PCC may be formed of or include at least one of conductive materials (e.g., metallic materials).

Figure 7A:
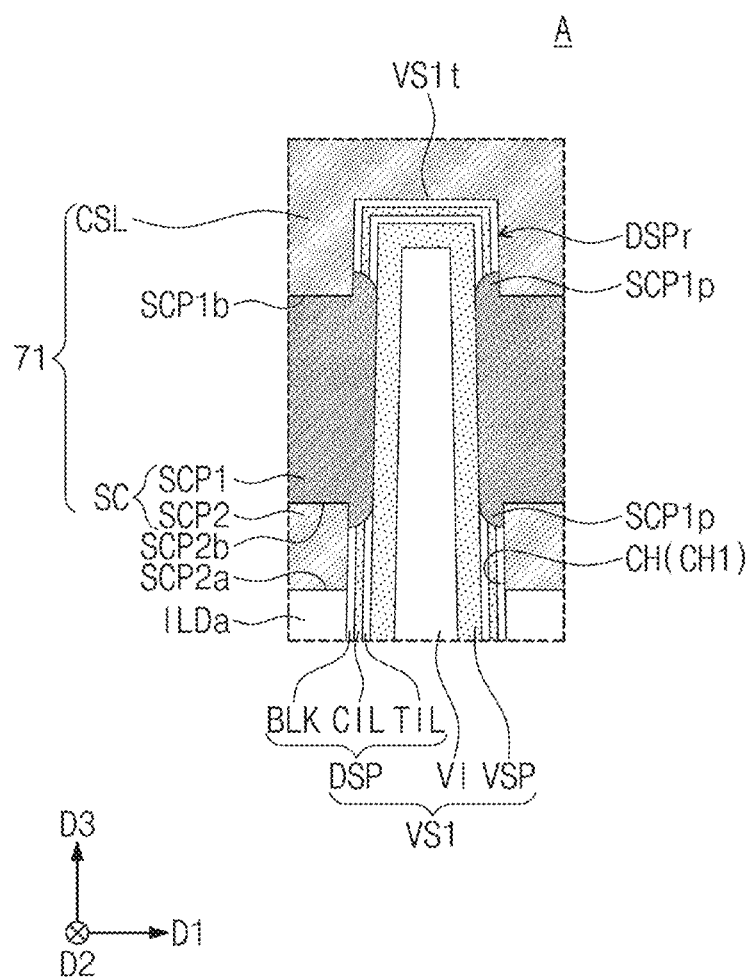
FIGS. 7A and 7B are enlarged views, each of which illustrates a portion of a three-dimensional semiconductor memory device according to an embodiment of inventive concepts, FIG. 7A corresponds to a portion 'A' of FIG. 6A, and FIG. 7B corresponds to a portion 'B' of FIG. 6B or a portion 'C' of FIG. 6A.

FIG. 7A is an enlarged view illustrating a portion of a three-dimensional semiconductor memory device according to an embodiment of inventive concepts and corresponding to a portion 'A' of FIG. 6A.

The first portion 71 of the second substrate 70, which includes the common source region CSL and the source structure SC, and the first vertical channel structure VS1, which includes the data storage pattern DSP, the vertical semiconductor pattern VSP, the gap-fill insulating pattern VI, and a lower data storage pattern DSPr, will be described in more detail with reference to FIGS. 6A and 7A. The remaining ones of the vertical channel holes CH and the first vertical channel structures VS1 may have substantially the same features as those to be described hereinafter.

A top surface VS1t of the first vertical channel structure VS1 may be in contact with the common source region CSL. The top surface VS1t of the first vertical channel structure VS1 may correspond to a top surface of the lower data storage pattern DSPr. The top surface VS1t of the first vertical channel structure VS1 may be located at a level higher than a top surface SCP1b of the first source conductive pattern SCP1.

The data storage pattern DSP may include a blocking insulating layer BLK, a charge storing layer CIL, and a tunneling insulating layer TIL, which are sequentially stacked on a side surface of the vertical channel hole CH. The blocking insulating layer BLK may be adjacent to the stack ST or the source structure SC, and the tunneling insulating layer TIL may be adjacent to the vertical semiconductor pattern VSP. The charge storing layer CIL may be interposed between the blocking insulating layer BLK and the tunneling insulating layer TIL. The blocking insulating layer BLK, the charge storing layer CIL, and the tunneling insulating layer TIL may be extended from a region between the stack ST and the vertical semiconductor pattern VSP in the third direction D3. In an embodiment, the Fowler-Nordheim (FN) tunneling phenomenon, which is caused by a voltage difference between the vertical semiconductor pattern VSP and the first and second gate electrodes ELa and ELb, may be used to store or change data in the data storage pattern DSP. In an embodiment, the blocking insulating layer BLK and the tunneling insulating layer TIL may be formed of or include silicon oxide, and the charge storing layer CIL may be formed of or include silicon nitride or silicon oxynitride.

The first source conductive pattern SCP1 of the source structure SC may be in contact with the vertical semiconductor pattern VSP, and the second source conductive pattern SCP2 may be spaced apart from the vertical semiconductor pattern VSP with the data storage pattern DSP interposed therebetween. The first source conductive pattern SCP1 may be spaced apart from the gap-fill insulating pattern VI with the vertical semiconductor pattern VSP interposed therebetween.

More specifically, the first source conductive pattern SCP1 may include protruding portions SCP1p, which are located at a level lower than a top surface SCP2b of the second source conductive pattern SCP2 or higher than the top surface SCP1*b* of the first source conductive pattern SCP1. However, the protruding portions SCP1*p* may be located at a level higher than a bottom surface SCP2*a* of the second source conductive pattern SCP2. In an embodiment, each of the protruding portions SCP1*p*, which are in contact with the data storage pattern DSP or the lower data storage pattern DSPr, may have a curved surface.

Figure 7B:
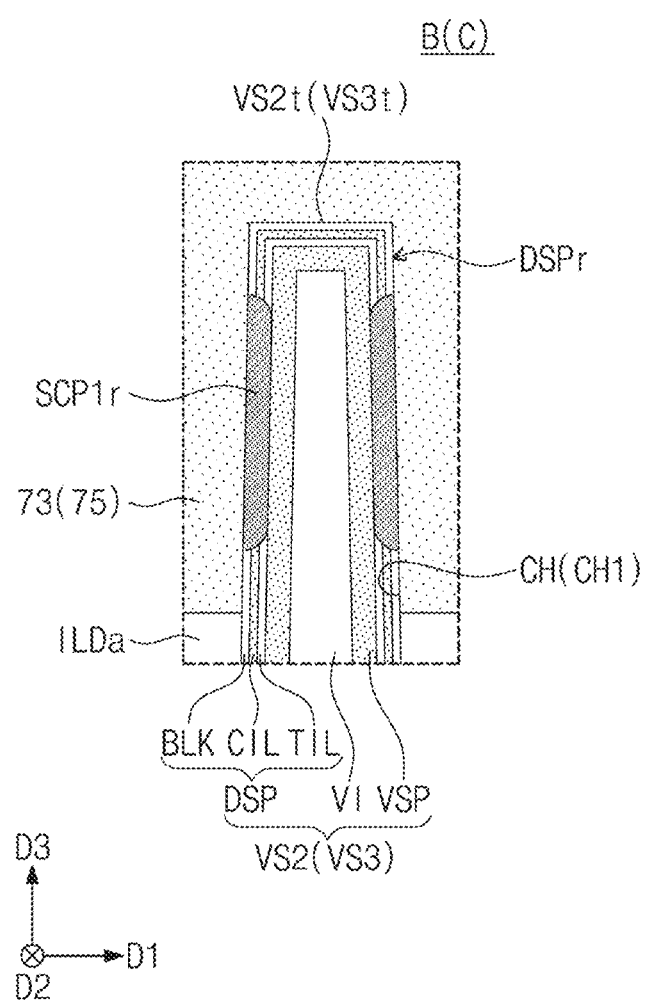

FIG. 7B is an enlarged view illustrating a portion of a three-dimensional semiconductor memory device according to an embodiment of inventive concepts and corresponding to a portion 'B' of FIG. 6B or a portion 'C' of FIG. 6A. In the following description, an element previously described with reference to FIG. 7A may be identified by a similar or identical reference number without repeating an overlapping description thereof, for concise description.

In order to reduce complexity in the drawings and to provide better understanding of an embodiment of inventive concepts, the second or third portion 73 or 75 of the second substrate 70 and the second or third vertical channel structure VS2 or VS3 (including the data storage pattern DSP, the vertical semiconductor pattern VSP, the gap-fill insulating pattern VI, and the lower data storage pattern DSPr) are illustrated in FIG. 7B as an example. The remaining ones of the vertical channel holes CH and the second and third vertical channel structures VS2 and VS3 may have substantially the same features as those to be described hereinafter.

A top surface VS2*t* of the second vertical channel structure VS2 or a top surface VS3*t* of the third vertical channel structure VS3 may be in contact with the second or third portion 73 or 75 of the second substrate 70. The top surface VS2*t* of the second vertical channel structure VS2 or the top surface VS3*t* of the third vertical channel structure VS3 may be located at a level higher than a top surface of a remnant source conductive pattern SCP1*r*.

The remnant source conductive pattern SCP1*r* may be provided on a side surface of the vertical channel hole CH. A side surface of the remnant source conductive pattern SCP1*r* may be in contact with the vertical semiconductor pattern VSP of one of the second and third vertical channel structures VS2 and VS3, and an opposite side surface of the remnant source conductive pattern SCP1*r* may be in contact with the second or third portion 73 or 75 of the second substrate 70. The remnant source conductive pattern SCP1*r* may be located at substantially the same level as the first source conductive pattern SCP1 of FIG. 7A and may be formed of or include substantially the same material as the first source conductive pattern SCP1 of FIG. 7A. For example, a surface of the remnant source conductive pattern SCP1*r*, which is in contact with the data storage pattern DSP or the lower data storage pattern DSPr, may have a curved shape.

Figure 8A:
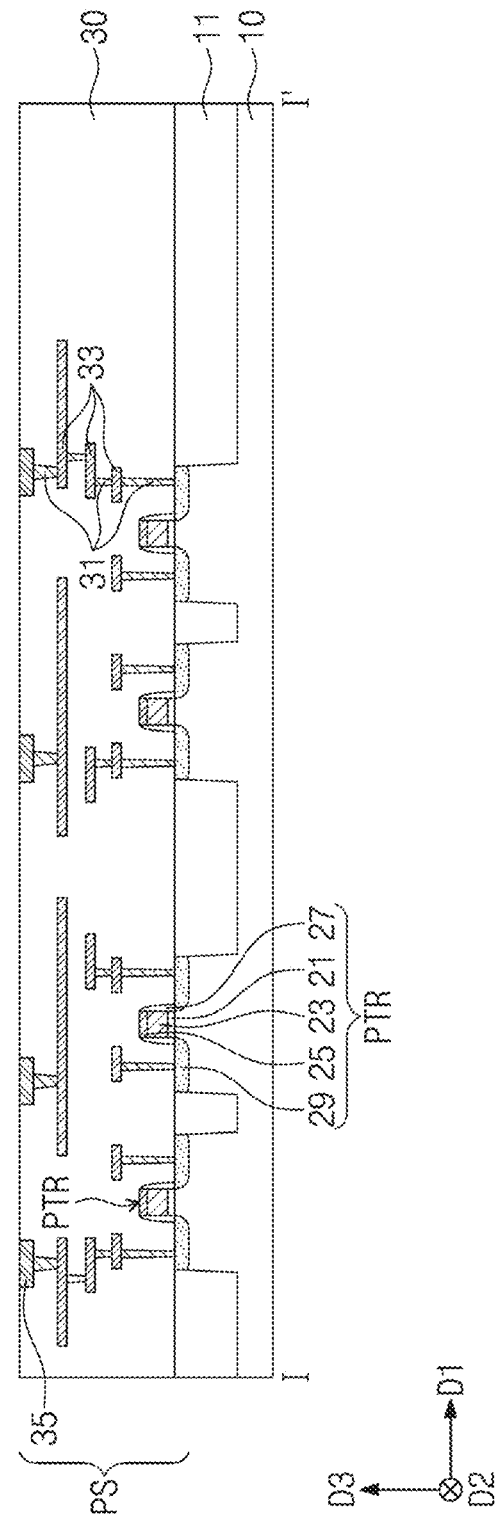
FIGS. 8A and 8B are sectional views, which are respectively taken along the lines I-I' and II-II' of FIG. 5 to illustrate a method of fabricating a three-dimensional semiconductor memory device, according to an embodiment of inventive concepts.
Figure 8B:
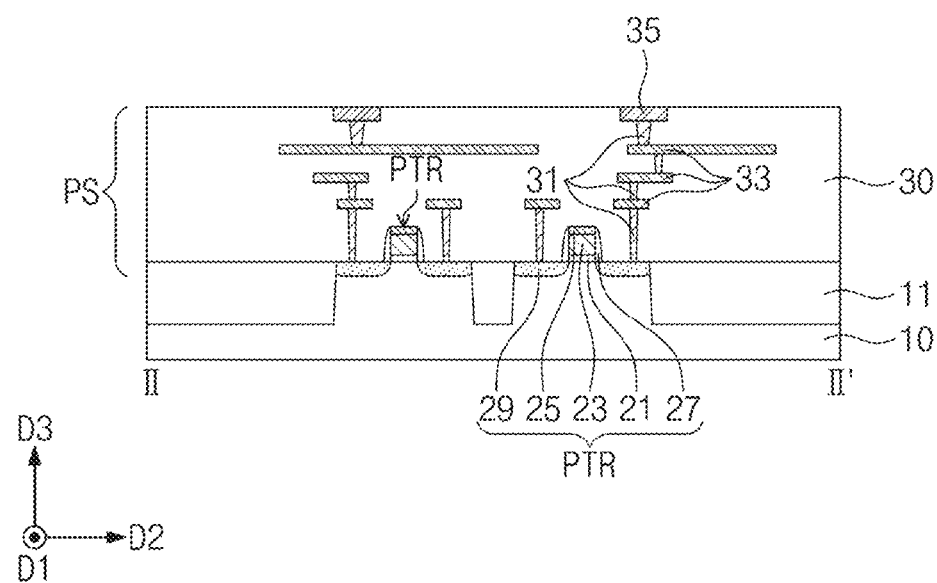

FIGS. 8A and 8B are sectional views, which are respectively taken along the lines I-I' and II-II' of FIG. 5 to illustrate a method of fabricating a three-dimensional semiconductor memory device, according to an embodiment of inventive concepts. FIGS. 9 and 11 are plan views illustrating a method of fabricating a three-dimensional semiconductor memory device, according to an embodiment of inventive concepts. FIGS. 10A to 13A and 10B to 13B are sectional views, which are respectively taken along lines III-III' and IV-IV' of FIG. 9 or 11 to illustrate a method of fabricating a three-dimensional semiconductor memory device according to an embodiment of inventive concepts. FIGS. 14A and 14B are sectional views, which are respectively taken along the lines I-I' and II-II' of FIG. 5 to illustrate a method of fabricating a three-dimensional semiconductor memory device according to an embodiment of inventive concepts.

Hereinafter, a method of fabricating a three-dimensional semiconductor memory device, according to an embodiment of inventive concepts, will be described in more detail with reference to FIGS. 8A and 8B to 14A and 14B.

Referring to FIGS. 8A and 8B, the peripheral circuit structure PS may be formed on the first substrate 10. The formation of the peripheral circuit structure PS may include forming the device isolation layer 11 in the first substrate 10 to define an active region, forming the peripheral transistors PTR on the active region of the first substrate 10, and forming the peripheral contact plugs 31, the peripheral circuit interconnection lines 33, the first bonding pads 35, which are electrically connected to the peripheral transistors PTR, and the first insulating layer 30 covering them.

The first bonding pads 35 may be formed to have top surfaces that are substantially coplanar with a top surface of the first insulating layer 30. In the following description, the expression of "two elements are coplanar with each other" may mean that a planarization process may be performed on the elements. The planarization process may be performed using, for example, a chemical mechanical polishing (CMP) process or an etch-back process.

Figure 10A:
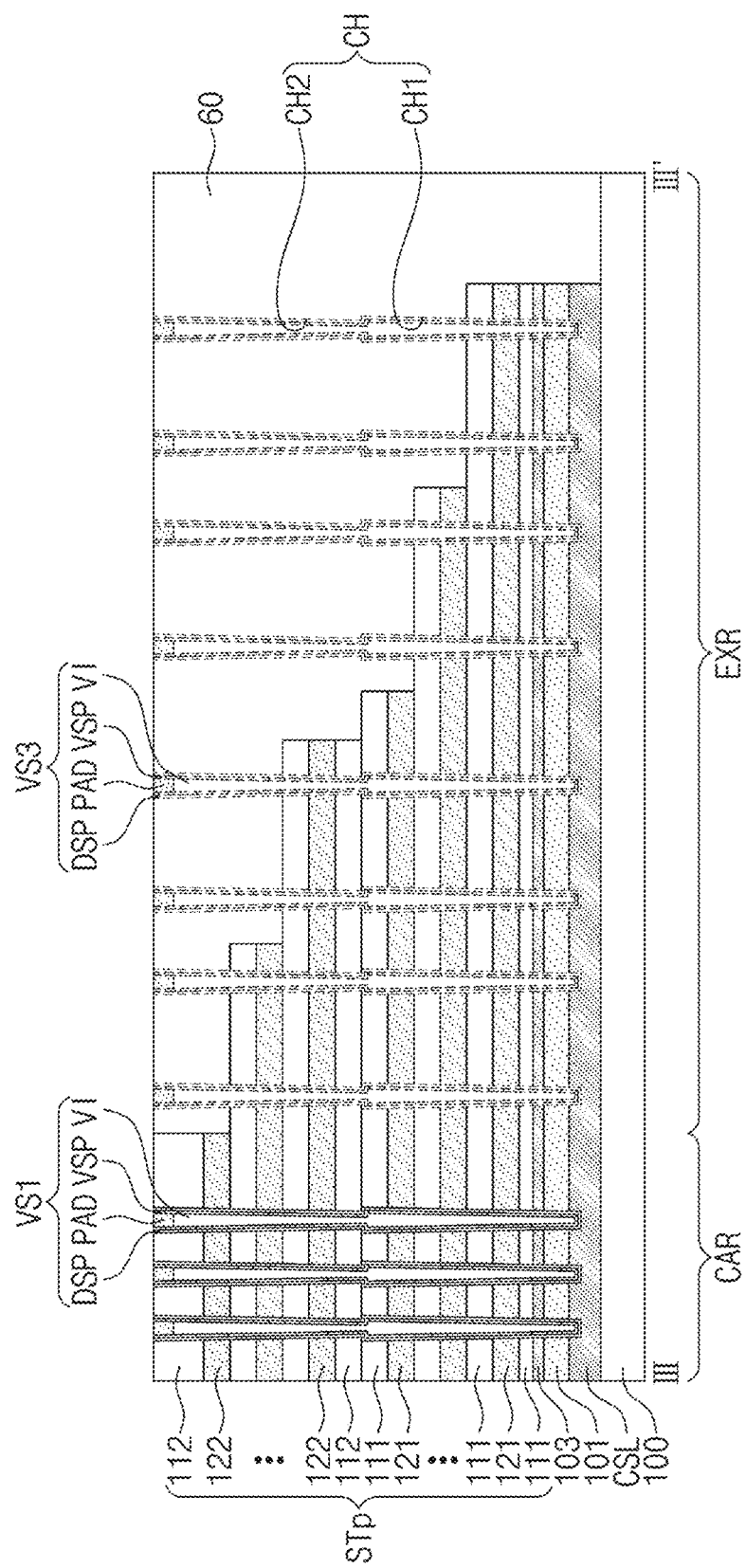
Figure 10B:
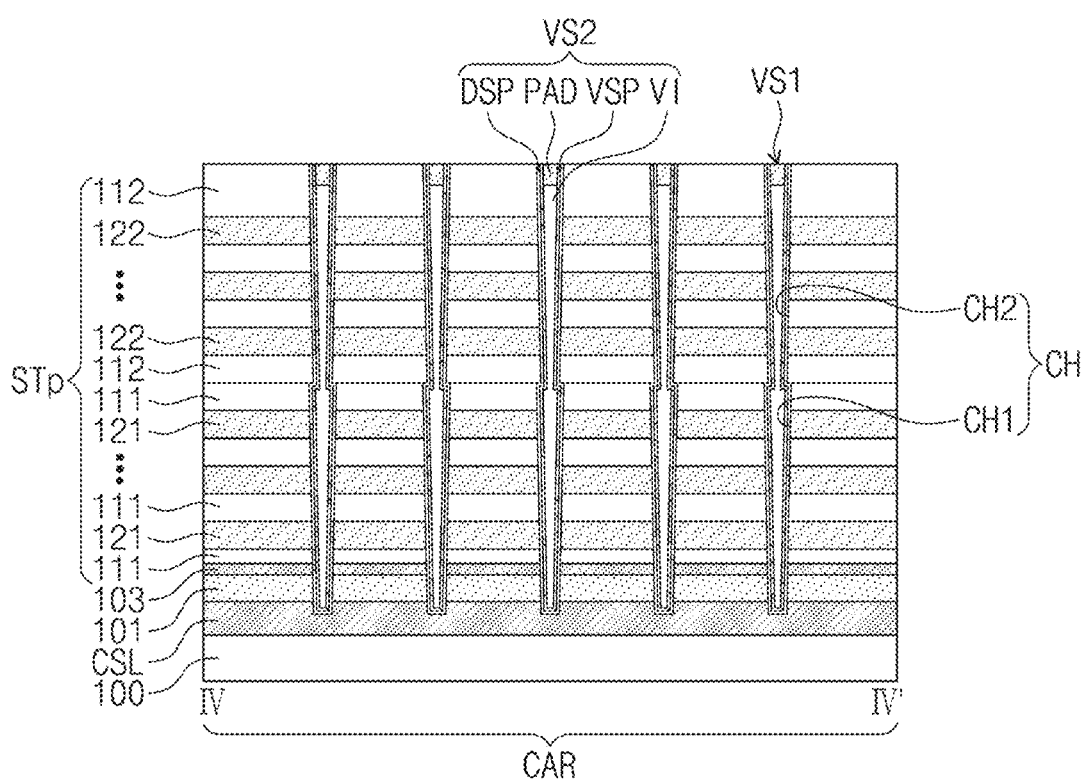
Figure 11:
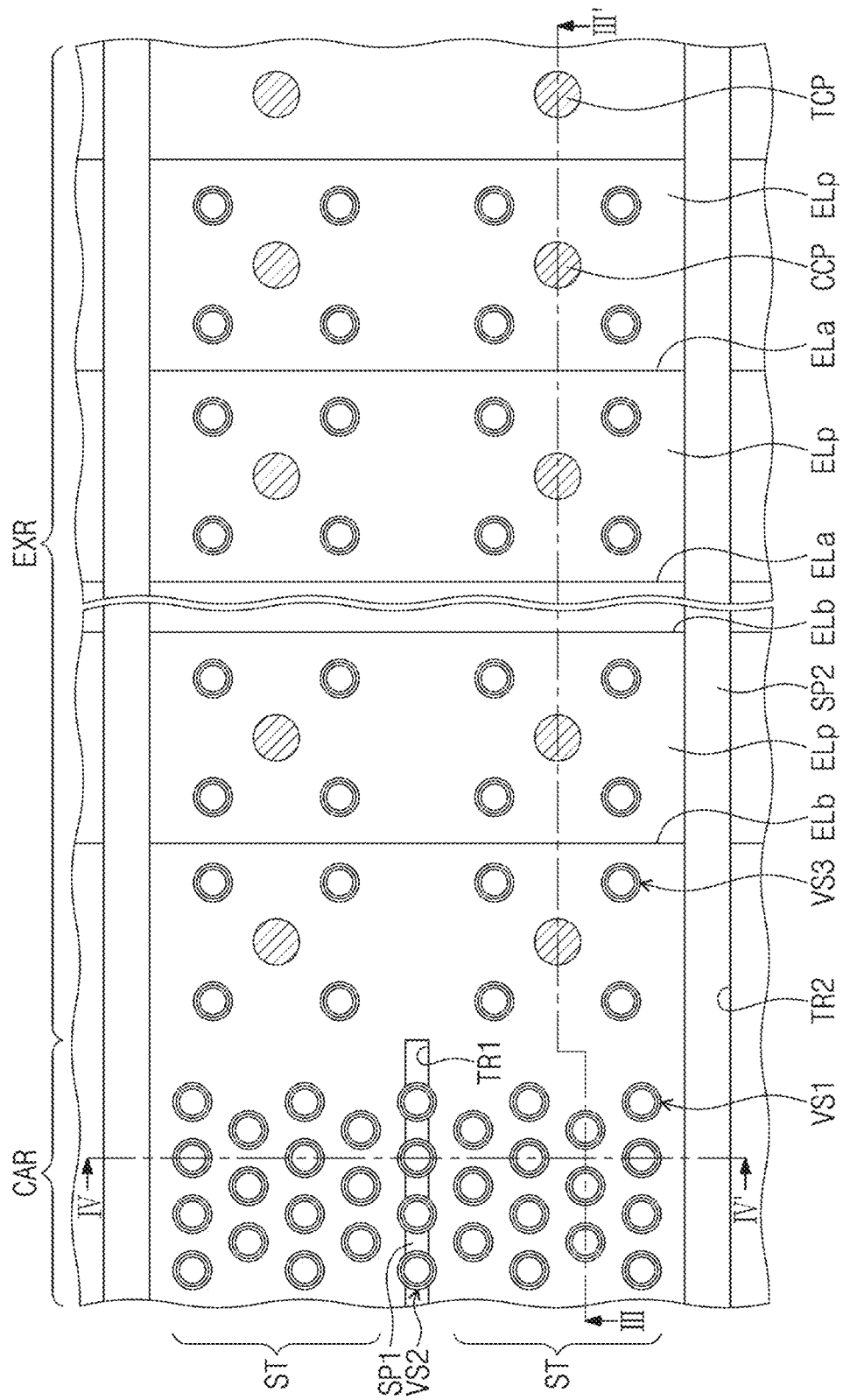
Figure 12A:
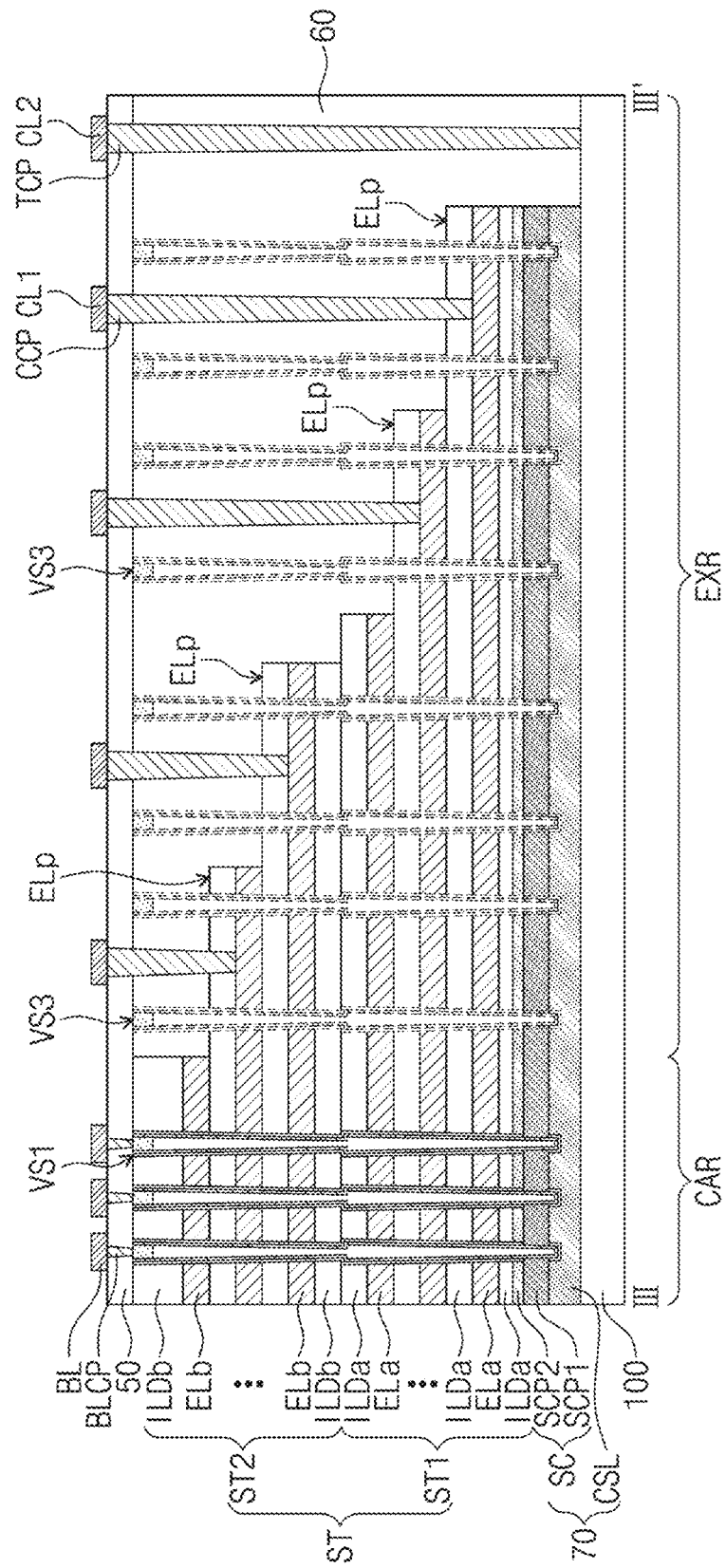
Figure 12B:
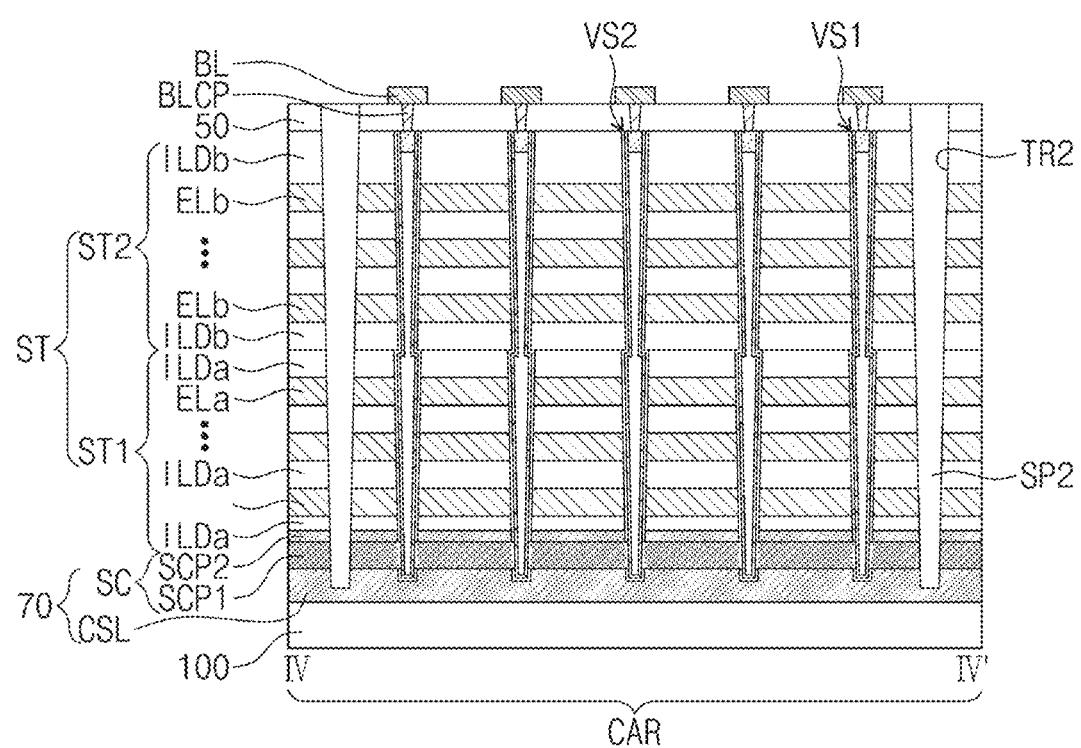

Referring to FIGS. 9, 10A, and 10B, a common source region CSL, a lower sacrificial layer 101, and a lower semiconductor layer 103 may be formed on a carrier substrate 100. In an embodiment, the common source region CSL and the lower semiconductor layer 103 may be formed by depositing a doped semiconductor material of first conductivity type (e.g., n-type) on the carrier substrate 100. The lower sacrificial layer 101 may be formed of or include, for example, silicon nitride. In an embodiment, the lower sacrificial layer 101 may be a multi-layered structure including a plurality of insulating layers.

A preliminary stack STp may be formed on the lower semiconductor layer 103, and in an embodiment, the preliminary stack STp may include first and second interlayer dielectric layers 111 and 112 and first and second sacrificial layers 121 and 122, which are alternately and repeatedly stacked on the lower semiconductor layer 103. The first and second sacrificial layers 121 and 122 may be formed of or include an insulating material that is different from the first and second interlayer dielectric layers 111 and 112. The first and second sacrificial layers 121 and 122 may be formed of a material that can be etched with an etch selectivity with respect to the first and second interlayer dielectric layers 111 and 112. For example, the first and second sacrificial layers 121 and 122 may be formed of or include silicon nitride, and the first and second interlayer dielectric layers 111 and 112 may be formed of or include silicon oxide. Each of the first and second sacrificial layers 121 and 122 may have substantially the same thickness, and thicknesses of the first and second interlayer dielectric layers 111 and 112 may vary depending on their vertical position.

A trimming process may be performed on the preliminary stack STp. The trimming process may include forming a mask pattern on the cell array region CAR and the cell array contact region EXR to cover a portion of a top surface of the preliminary stack STp, patterning the preliminary stack STp using the mask pattern, reducing an area of the mask pattern, and patterning the preliminary stack STp using the mask pattern of the reduced area. In an embodiment, the steps of reducing the area of the mask pattern and patterning the preliminary stack STp using the mask pattern may be repeated several times during the trimming process. As a result of the trimming process, each of the first and second interlayer dielectric layers 111 and 112 may be at least partially exposed to the outside, and the preliminary stack STp may have a staircase structure on the cell array contact region EXR.

The fourth insulating layer 60 may be formed to cover the staircase structure of the preliminary stack STp. The fourth insulating layer 60 may cover at least a portion of the carrier substrate 100. A top surface of the fourth insulating layer 60 may be substantially coplanar with a top surface of the topmost one of the second interlayer dielectric layers 112 of the preliminary stack STp.

The vertical channel holes CH may be formed to penetrate the first and second interlayer dielectric layers 111 and 112 and the first and second sacrificial layers 121 and 122 of the preliminary stack STp, the lower semiconductor layer 103, the lower sacrificial layer 101, and at least a portion of the common source region CSL in a high aspect ratio. The vertical channel holes CH may further penetrate the fourth insulating layer 60, on the cell array contact region EXR.

The vertical channel holes CH may include the first vertical channel holes CH1, which are formed to penetrate the first interlayer dielectric layers 111 and the first sacrificial layers 121, and the second vertical channel holes CH2, which are formed to penetrate the second interlayer dielectric layers 112 and the second sacrificial layers 122. The second vertical channel holes CH2 may be overlapped with the first vertical channel holes CH1 in the third direction D3 and may be connected to the first vertical channel holes CH1.

The first and second vertical channel structures VS1 and VS2 may be formed in the vertical channel holes CH, which are formed on the cell array region CAR. The third vertical channel structures VS3 may be formed in the vertical channel holes CH, which are formed on the cell array contact region EXR.

The formation of each of the first to third vertical channel structures VS1, VS2, and VS3 may include forming the data storage pattern DSP and the vertical semiconductor pattern VSP to conformally cover an inner side surface of each of the vertical channel holes CH, forming the gap-fill insulating pattern VI to fill a remaining space of the vertical semiconductor pattern VSP, and forming the conductive pad PAD in a space enclosed by the gap-fill insulating pattern VI and the data storage pattern DSP. In an embodiment, the first to third vertical channel structures VS1, VS2, and VS3 may have top surfaces that are substantially coplanar with the top surface of the topmost one of the second interlayer dielectric layers 112 and the top surface of the fourth insulating layer 60.

Referring to FIGS. 10A, 10B, 11, 12A, and 12B, the third insulating layer 50 may be formed to cover the top surface of the topmost one of the second interlayer dielectric layers 112 and the top surface of the fourth insulating layer 60.

The first and second trenches TR1 and TR2 may be formed to penetrate the third insulating layer 50, the preliminary stack STp, the lower semiconductor layer 103, the lower sacrificial layer 101, and at least a portion of the common source region CSL. The first and second trenches TR1 and TR2 may be extended from the cell array region CAR to the cell array contact region EXR. A depth of the first trench TR1 may be smaller than a depth of the second trench TR2. A bottom surface of the first trench TR1 may be located at a level that is higher than the top surface of the topmost one of the first interlayer dielectric layers 111. A bottom surface of the second trench TR2 may be located at a level that is lower than the bottom surfaces of the first to third vertical channel structures VS1, VS2, and VS3.

The first and second sacrificial layers 121 and 122 and the lower sacrificial layer 101, which are exposed through the first and second trenches TR1 and TR2, may be removed. For example, the first and second sacrificial layers 121 and 122 and the lower sacrificial layer 101 may be removed by a wet etching process using hydrofluoric acid (HF) and/or phosphoric acid ($H_3PO_4$) solution.

The data storage pattern DSP of each of the first and second vertical channel structures VS1 and VS2, which is exposed through an empty space formed by removing the lower sacrificial layer 101, may be partially removed, when the lower sacrificial layer 101 is removed.

The first source conductive pattern SCP1 may be formed to fill the empty space formed by removing the lower sacrificial layer 101. The first source conductive pattern SCP1 may be in contact with the vertical semiconductor pattern VSP of each of the first and second vertical channel structures VS1 and VS2. In an embodiment, the first source conductive pattern SCP1 may be formed of or include at least one of doped semiconductor materials. Although not shown, an air gap may be formed in the first source conductive pattern SCP1. The lower semiconductor layer 103 may be referred to as the second source conductive pattern SCP2, and the source structure SC including the first and second source conductive patterns SCP1 and SCP2 may be formed. As a result, the second substrate 70 including the source structure SC and the common source region CSL may be formed.

The first and second gate electrodes ELa and ELb may be formed to fill empty regions formed by removing the first and second sacrificial layers 121 and 122. The first and second interlayer dielectric layers 111 and 112 may be referred to as the first and second interlayer dielectric layers ILDa and ILDb of the first and second stacks ST1 and ST2, and as a result, the stack ST including the first and second interlayer dielectric layers ILDa and ILDb and the first and second gate electrodes ELa and ELb may be formed.

The first separation pattern SP1 and the second separation pattern SP2 may be formed to fill the first trench TR1 and the second trench TR2, respectively. Top surfaces of the first and second separation patterns SP1 and SP2 may be substantially coplanar with the top surface of the third insulating layer 50.

The bit line contact plugs BLCP may be formed on the cell array region CAR to penetrate the third insulating layer 50 and to be in contact with top surfaces of the first and second vertical channel structures VS1 and VS2. The cell contact plugs CCP may be formed on the cell array contact region EXR to penetrate the third and fourth insulating layers 50 and 60 and to be in contact with the pad portions ELp of the first and second gate electrodes ELa and ELb. The cell contact plugs CCP may be formed to at least partially penetrate the first and second interlayer dielectric layers ILDa and ILDb. The penetration contact plug TCP may be formed on the cell array contact region EXR to penetrate the third and fourth insulating layers 50 and 60 and to be in contact with the top surface of the carrier substrate 100. The penetration contact plug TCP may be spaced apart from the stack ST and the outermost one of the cell contact plugs CCP.

On the cell array region CAR, the bit lines BL may be formed on the third insulating layer 50 to be in contact with the bit line contact plugs BLCP. On the cell array contact region EXR, the first and second conductive lines CL1 and CL2 may be formed on the third insulating layer 50 to be in contact with the cell contact plugs CCP and the penetration contact plug TCP.

Figure 13A:
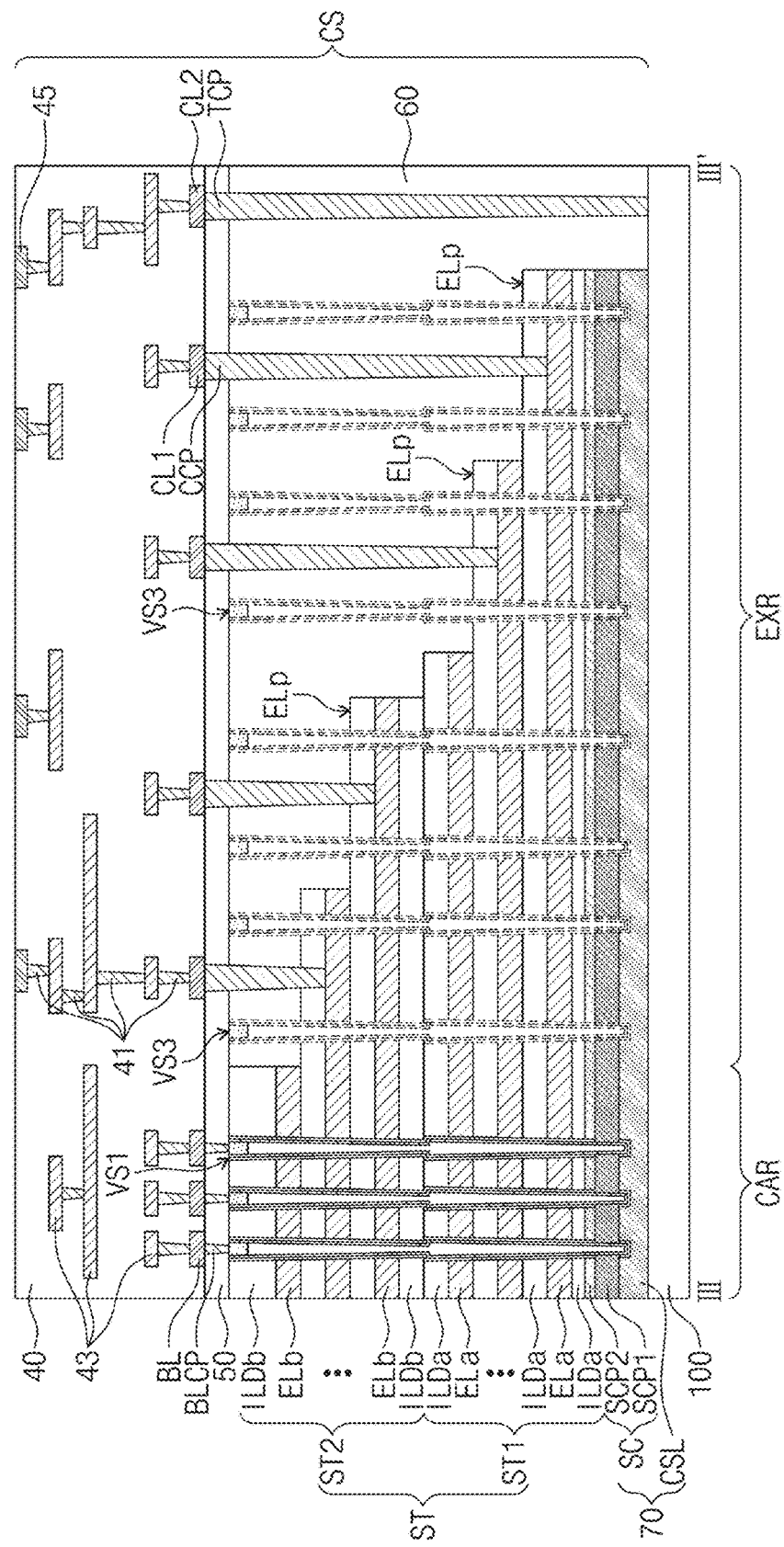
Figure 13B:
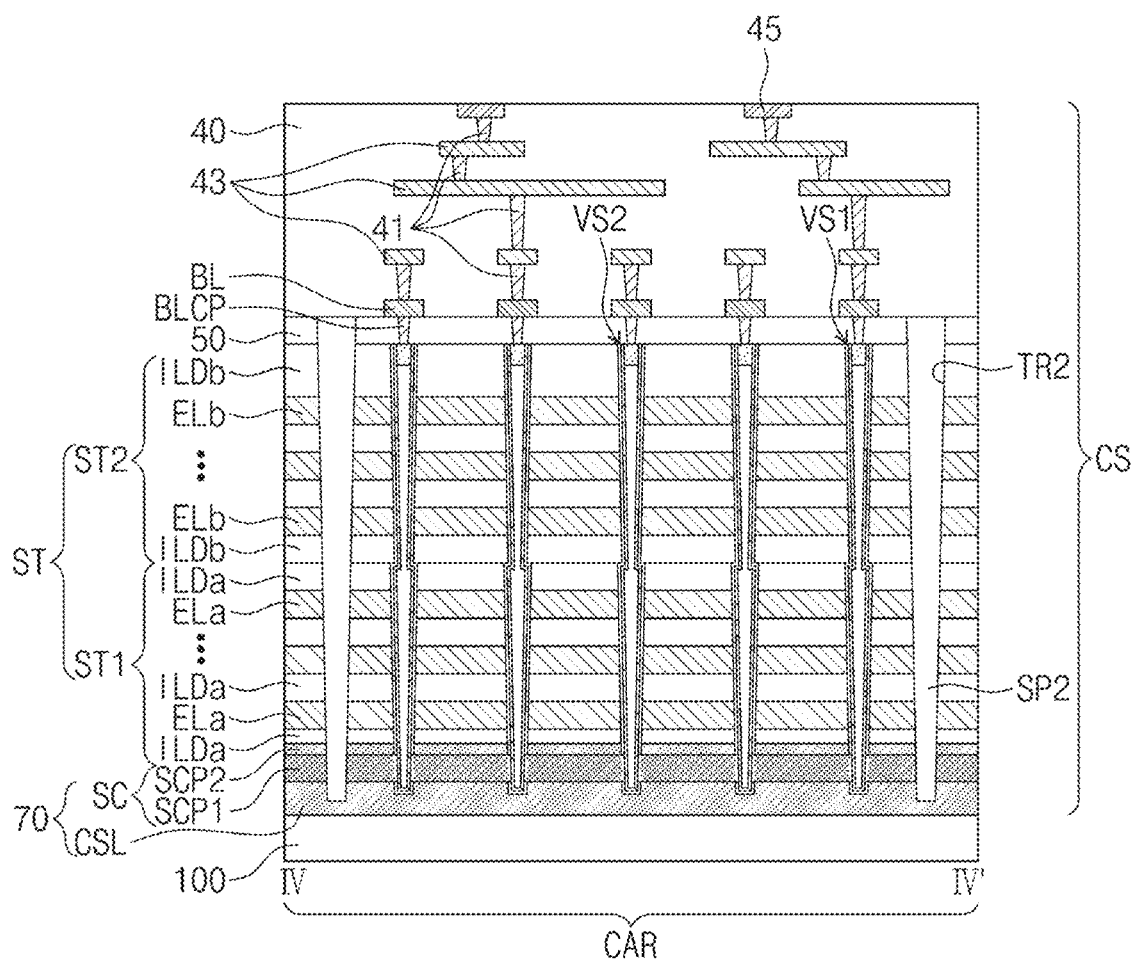
Figure 14A:
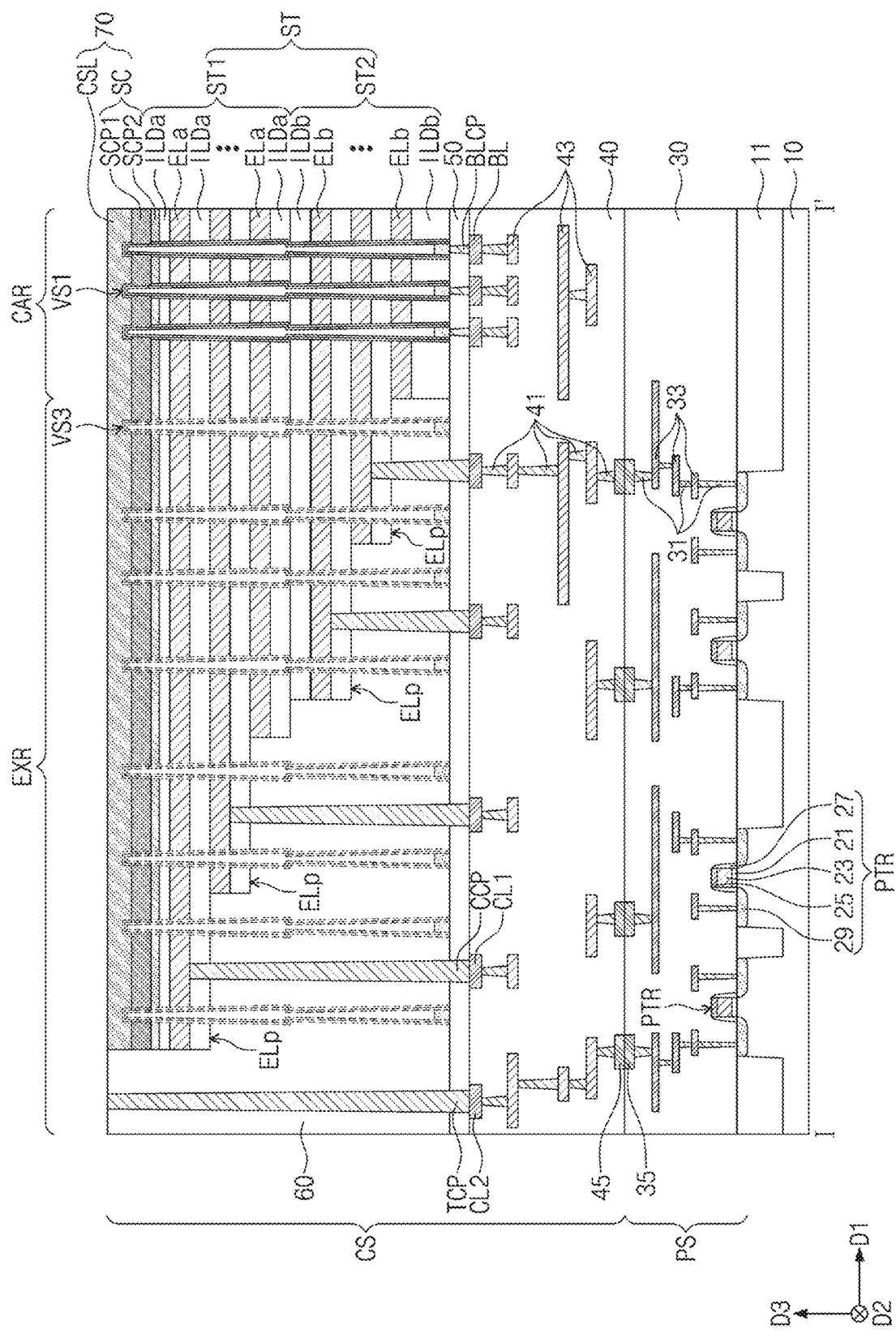
FIGS. 14A and 14B are sectional views, which are respectively taken along the lines I-I' and II-II' of FIG. 5 to illustrate a method of fabricating a three-dimensional semiconductor memory device according to an embodiment of inventive concepts.
Figure 14B:
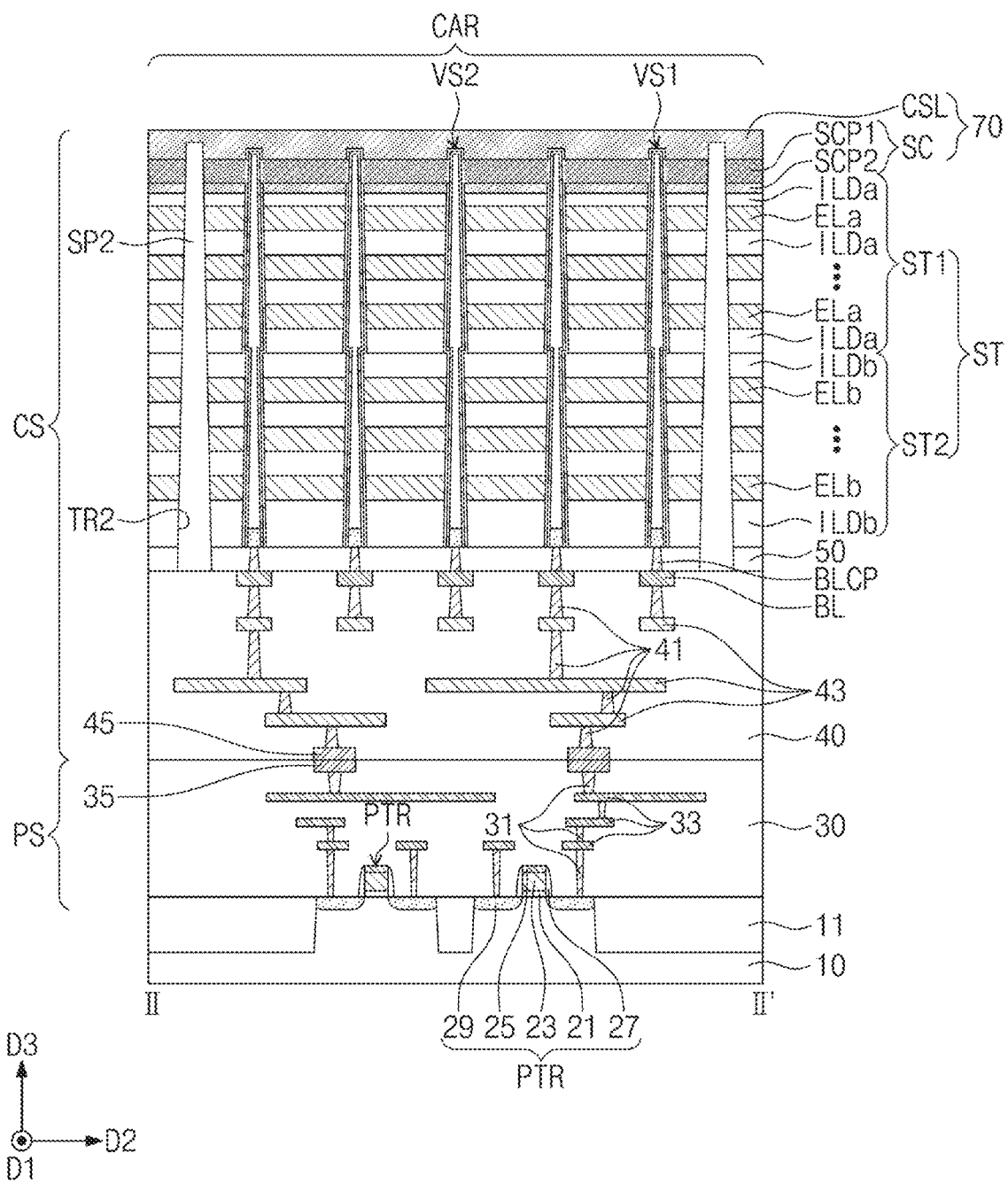

Referring to FIGS. 11, 13A, and 13B, the connection contact plugs 41, the connection circuit interconnection lines 43, the second bonding pads 45, and the second insulating layer 40 may be formed on the third insulating layer 50, and here, the connection contact plugs 41, the connection circuit interconnection lines 43, and the second bonding pads 45 may be electrically connected to the bit lines BL and the first and second conductive lines CL1 and CL2, and the second insulating layer 40 may be formed to cover them. The second bonding pads 45 may be formed to have top surfaces that are substantially coplanar with the top surface of the second insulating layer 40. The cell array structure CS may be formed on the carrier substrate 100 by the method described with reference to FIGS. 9 to 13A and 13B.

Referring to FIGS. 5, 13A, 13B, 14A, and 14B, the cell array structure CS, which is formed on the carrier substrate 100, may be bonded to the peripheral circuit structure PS, which is formed on the first substrate 10 by the method described with reference to FIGS. 8A and 8B. The carrier substrate 100 may be provided on the first substrate 10 such that the cell array structure CS faces the peripheral circuit structure PS. The peripheral circuit structure PS and the cell array structure CS may be bonded to each other by the first bonding pads 35 and the second bonding pads 45, which are in contact with each other and are fused into one. After the bonding of the first and second bonding pads 35 and 45, the carrier substrate 100 on the cell array structure CS may be removed.

Referring back to FIGS. 5, 6A, and 6B, an ion implantation process may be performed on a portion of the second substrate 70. In detail, the second portion 73 of the second substrate 70 may be formed by performing the ion implantation process on a portion of the second substrate 70, which is located on the cell array region CAR and is overlapped with the first separation pattern SP1 and the second vertical channel structures VS2 in the third direction D3, and the third portion 75 of the second substrate 70 may be formed by performing the ion implantation process on a portion of the second substrate 70, which is located on the cell array contact region EXR. The remaining portion of the second substrate 70, on which the ion implantation process is not performed, may be referred to as the first portion 71.

The ion implantation process may be performed to inject impurities (e.g., boron (B), aluminum (Al), gallium (Ga), indium (In), and so forth) of second conductivity type (e.g., p-type) into the portion of the second substrate 70. Since the second and third portions 73 and 75 of the second substrate 70 are doped to have a different conductivity type from the first portion 71, the second and third vertical channel structures VS2 and VS3, which are in contact with the second and third portions 73 and 75, respectively, may be in an electrically floated state, when an erase operation is performed.

After the ion implantation process, the fifth insulating layer 80 may be formed on the second substrate 70. The input/output pad IOP and the common source contacts PCC may be formed to penetrate the fifth insulating layer 80. Here, the input/output pad IOP may be connected to the penetration contact plug TCP, and the common source contacts PCC may be connected to the first portion 71 of the second substrate 70. The common source contacts PCC may be provided to penetrate at least a portion of the first portion 71 of the second substrate 70.

Figure 15A:
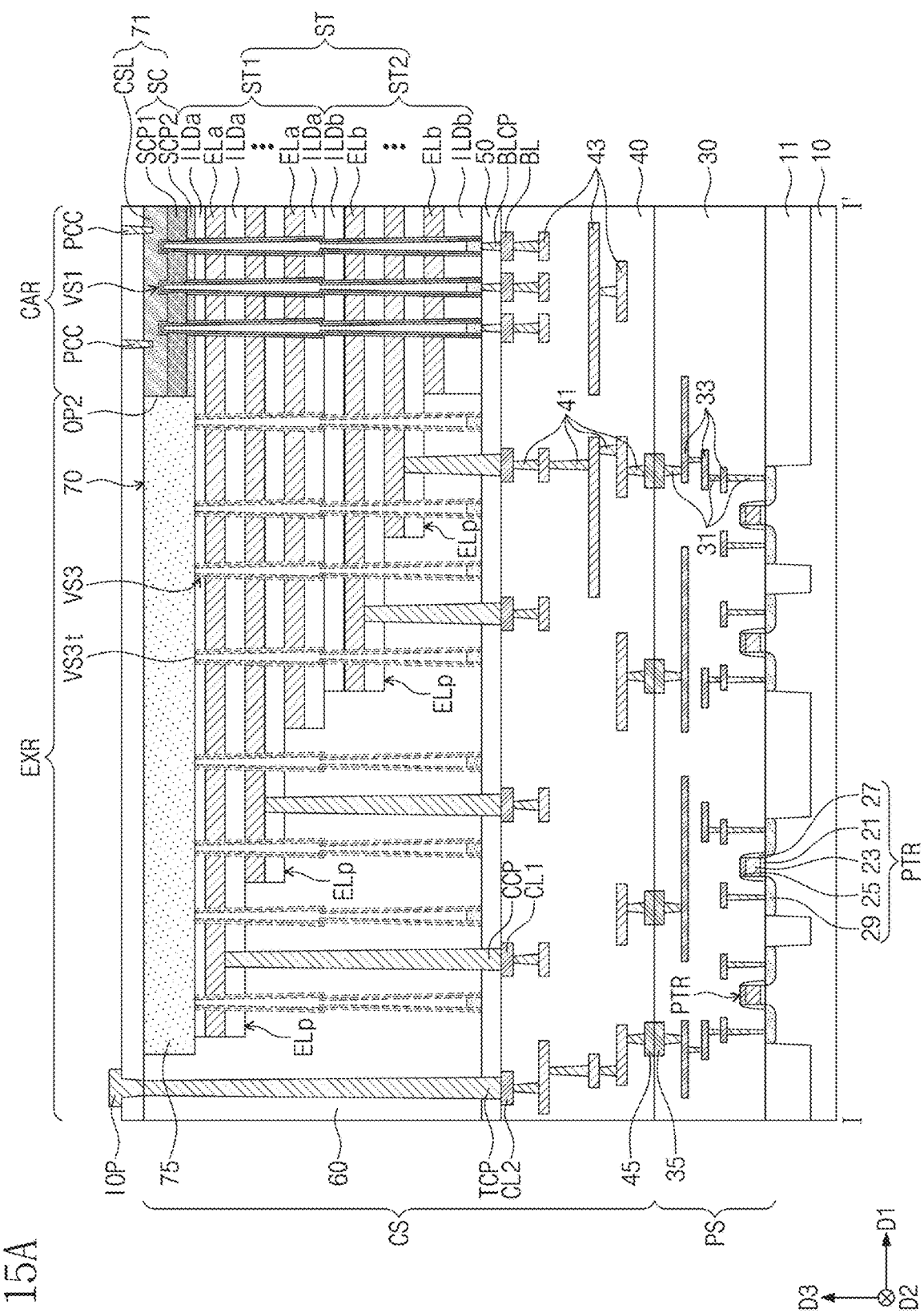
FIGS. 15A and 15B are sectional views, which are respectively taken along the lines I-I' and II-II' of FIG. 5 to illustrate a three-dimensional semiconductor memory device according to an embodiment of inventive concepts.
Figure 15B:
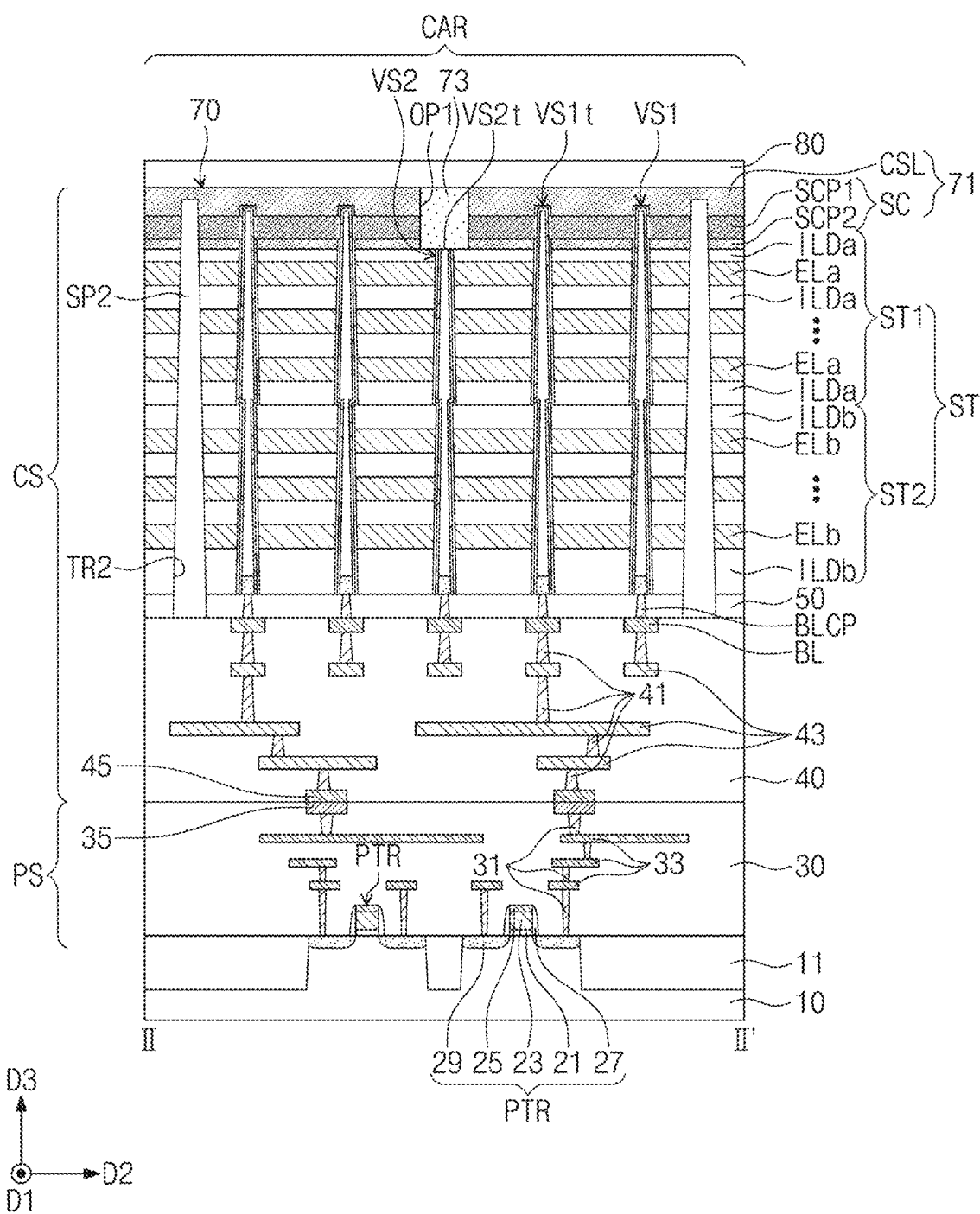

FIGS. 15A and 15B are sectional views, which are respectively taken along the lines I-I' and II-II' of FIG. 5 to illustrate a three-dimensional semiconductor memory device according to an embodiment of inventive concepts. In the following description, an element previously described with reference to FIGS. 5, 6A, and 6B may be identified by a similar or identical reference number without repeating an overlapping description thereof, for concise description.

Referring to FIGS. 5, 15A, and 15B, a length of each of the second and third vertical channel structures VS2 and VS3 in the third direction D3 may be smaller than a length of each of the first vertical channel structures VS1 in the third direction D3. The top surfaces VS2$t$ of the second vertical channel structures VS2 and the top surfaces VS3$t$ of the third vertical channel structures VS3 may be located at a level lower than the top surfaces VS1$t$ of the first vertical channel structures VS1. The top surfaces VS2$t$ of the second vertical channel structures VS2 may be in contact with the second portion 73 of the second substrate 70 filling a first opening OP1, and the top surfaces VS3$t$ of the third vertical channel structures VS3 may be in contact with the third portion 75 of the second substrate 70 filling a second opening OP2. The top surfaces VS2$t$ of the second vertical channel structures VS2 and the top surfaces VS3$t$ of the third vertical channel structures VS3 may be substantially coplanar with a bottom surface of the second substrate 70 and a top surface of the topmost one of the first interlayer dielectric layers ILDa.

Figure 16A:
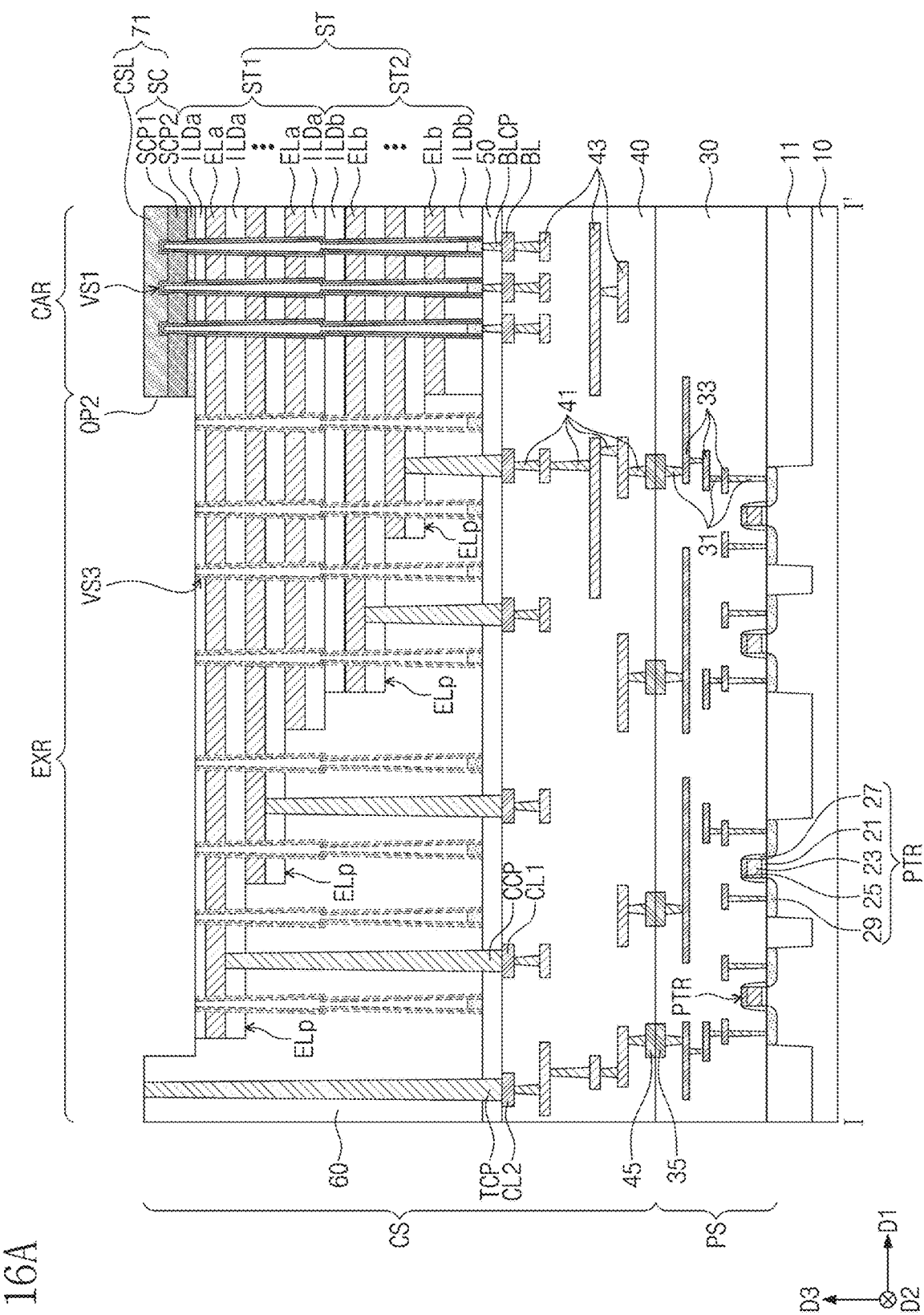
FIGS. 16A and 16B are sectional views, which are respectively taken along the lines I-I' and II-II' of FIG. 5 to illustrate a method of fabricating a three-dimensional semiconductor memory device, according to an embodiment of inventive concepts.
Figure 16B:
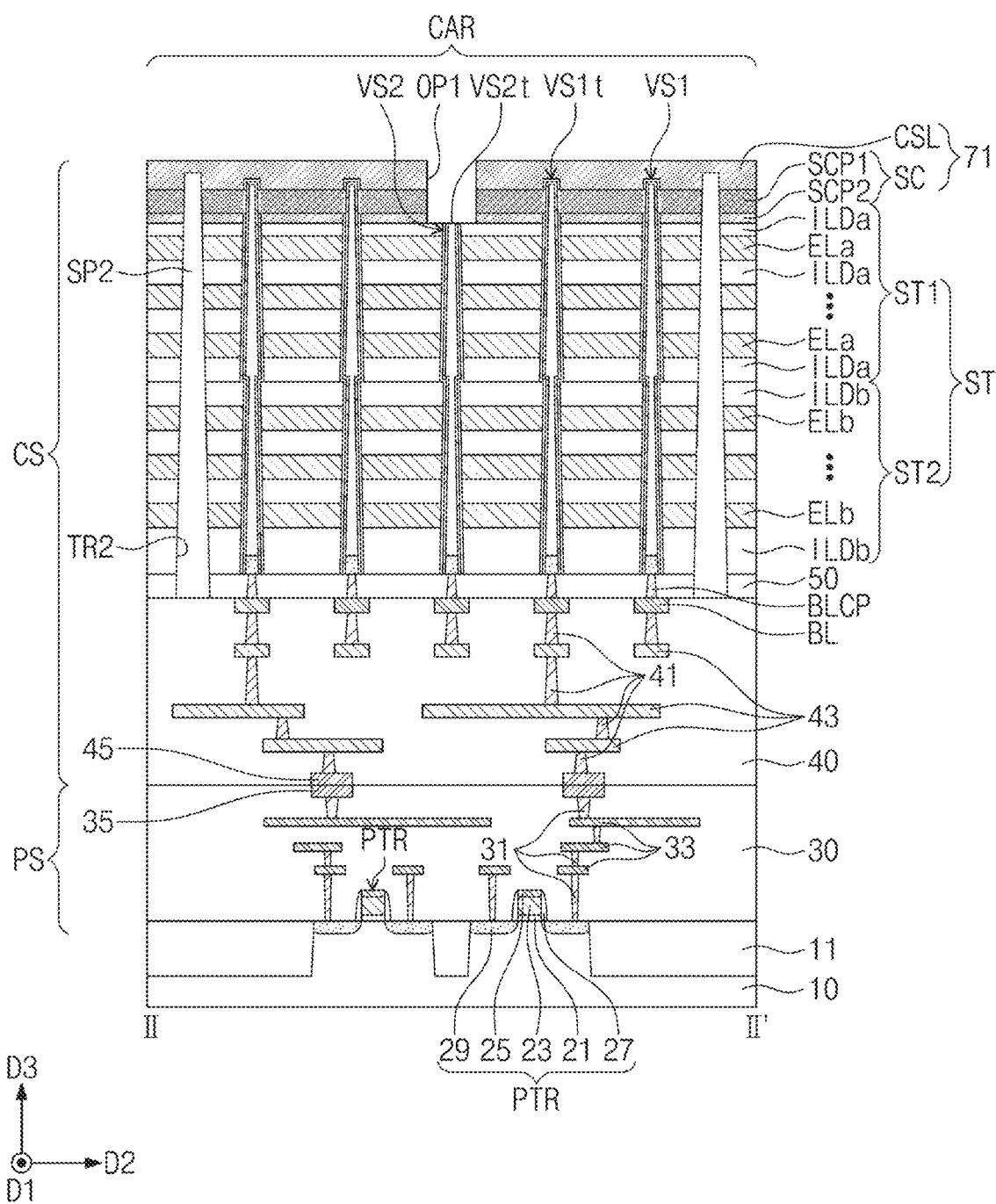

FIGS. 16A and 16B are sectional views, which are respectively taken along the lines I-I' and II-II' of FIG. 5 to illustrate a method of fabricating a three-dimensional semiconductor memory device, according to an embodiment of inventive concepts.

The peripheral circuit structure PS and the cell array structure CS may be formed on the first substrate 10 by the substantially the same method as described with reference to FIGS. 8A and 8B to FIGS. 14A and 14B.

Referring to FIGS. 5, 16A, and 16B, the first opening OP1 and the second opening OP2 may be formed by removing portions of the second substrate 70. In detail, the first opening OP1 may be formed by removing a portion of the second substrate 70, which is provided on the cell array region CAR and is overlapped with the first separation pattern SP1 and the second vertical channel structures VS2 in the third direction D3, and the second opening OP2 may be formed by removing a portion of the second substrate 70, which is provided on the cell array contact region EXR. During the formation of the first and second openings OP1 and OP2, a lower portion of each of the second and third vertical channel structures VS2 and VS3 may be removed along with the common source region CSL and the source structure SC of the second substrate 70.

Referring back to FIGS. 5, 15A, and 15B, the second portion 73 of the second substrate 70 may be formed in the first opening OP1, and the third portion 75 of the second substrate 70 may be formed in the second opening OP2. The remaining portion of the second substrate 70, except the first and second openings OP1 and OP2, may be referred to as the first portion 71. The formation of the second and third portions 73 and 75 of the second substrate 70 may include depositing a doped semiconductor layer of second conductivity type (e.g., p-type) to fill the first and second openings OP1 and OP2 or may include depositing an undoped or intrinsic semiconductor layer to fill the first and second openings OP1 and OP2 and then doping the undoped semiconductor layer with impurities of second conductivity type (e.g., p-type).

Figure 17A:
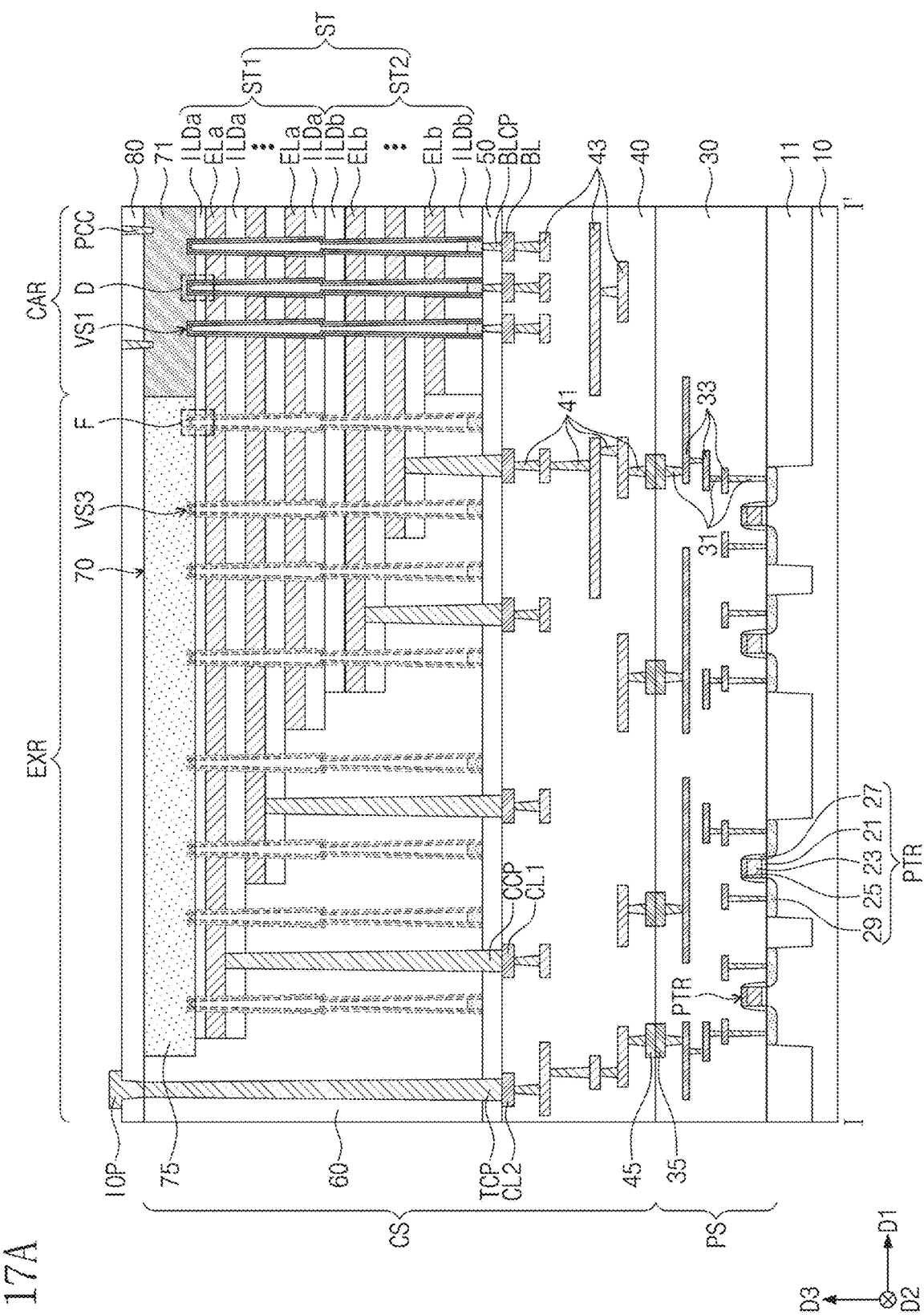
FIGS. 17A and 17B are sectional views, which are respectively taken along the lines I-I' and II-II' of FIG. 5 to illustrate a three-dimensional semiconductor memory device according to an embodiment of inventive concepts.
Figure 17B:
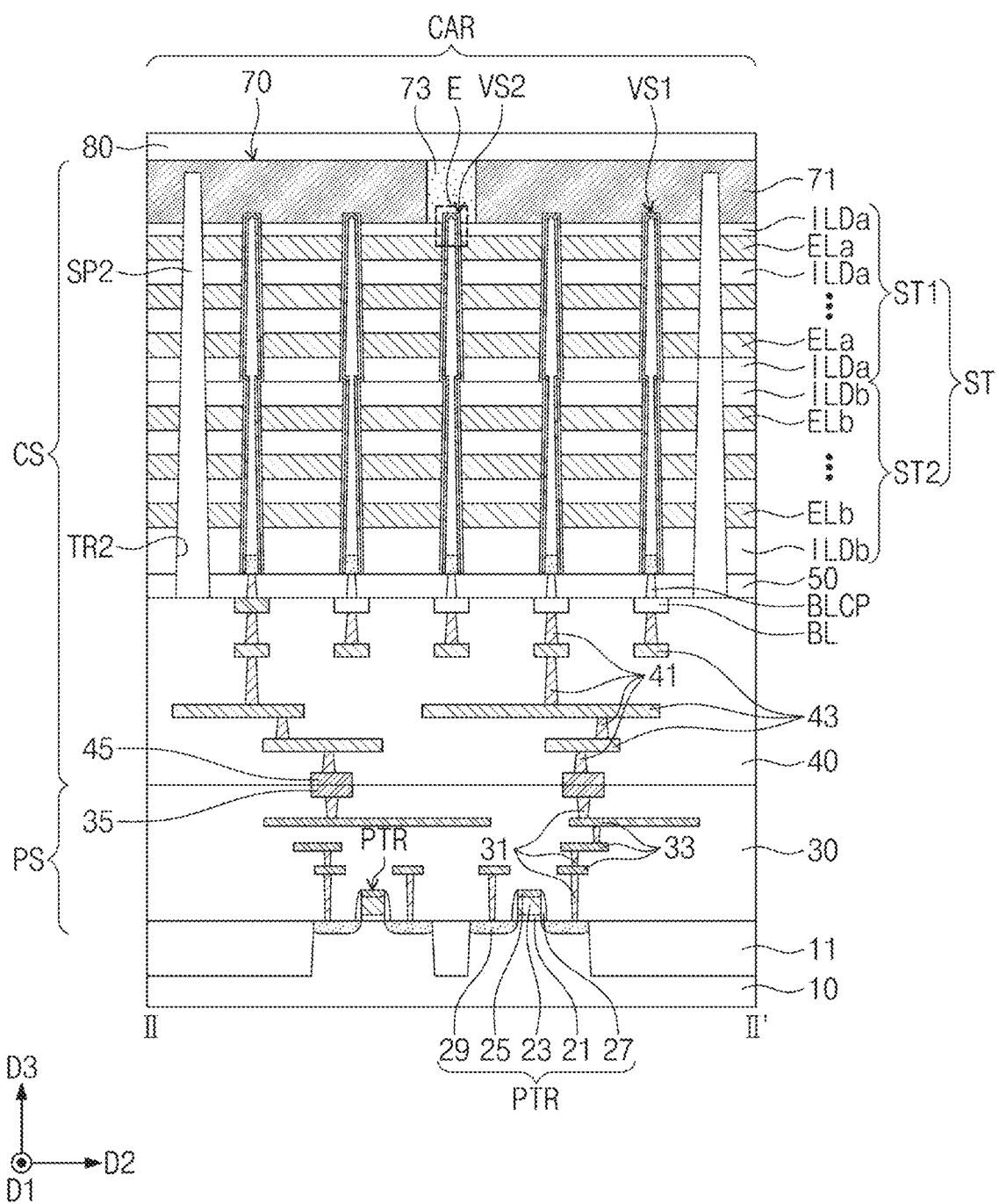
Figure 18A:
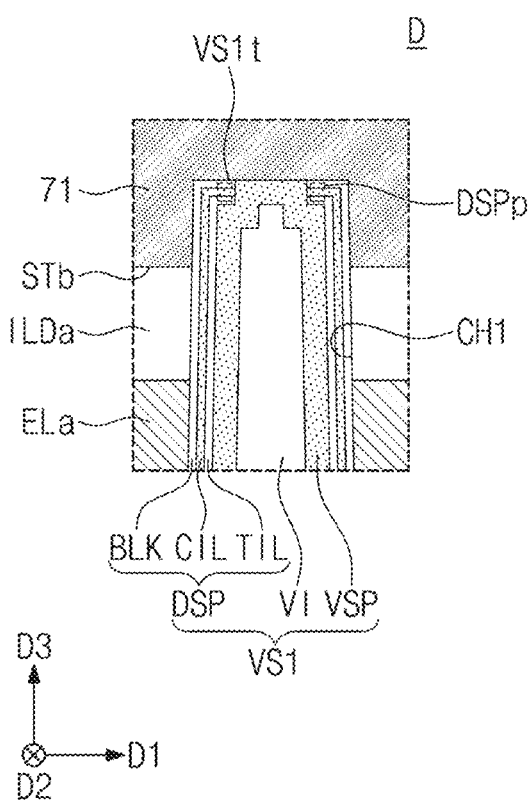
FIGS. 18A and 18B are enlarged views, each of which illustrates a portion of a three-dimensional semiconductor memory device according to an embodiment of inventive concepts, FIG. 18A corresponds to a portion 'D' of FIG. 17A, and FIG. 18B corresponds to a portion 'E' of FIG. 17B or a portion 'F' of FIG. 17A.
Figure 18B:
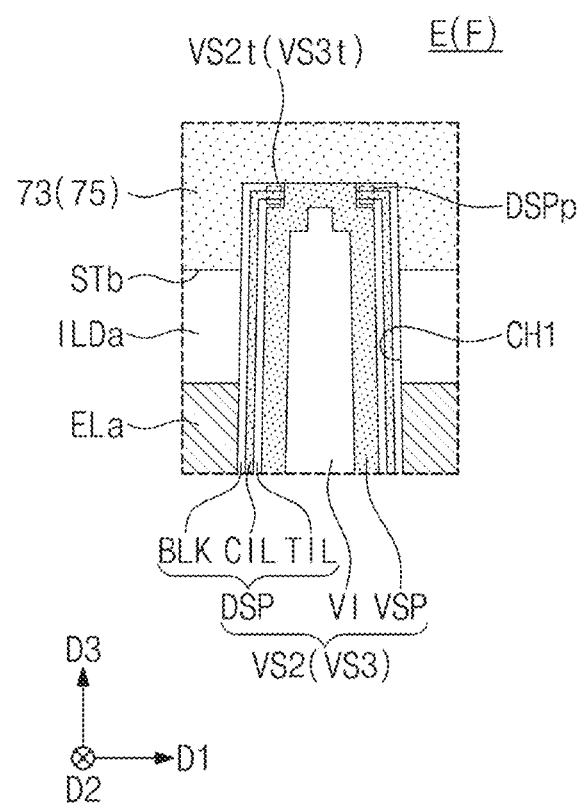

FIGS. 17A and 17B are sectional views, which are respectively taken along the lines I-I' and II-II' of FIG. 5 to illustrate a three-dimensional semiconductor memory device according to an embodiment of inventive concepts. FIGS. 18A and 18B are enlarged views, each of which illustrates a portion of a three-dimensional semiconductor memory device according to an embodiment of inventive concepts, FIG. 18A corresponds to a portion 'D' of FIG. 17A, and FIG. 18B corresponds to a portion 'E' of FIG. 17B or a portion 'F' of FIG. 17A. In the following description, an element previously described with reference to FIGS. 5, 6A, and 6B may be identified by a similar or identical reference number without repeating an overlapping description thereof, for concise description.

Referring to FIGS. 17A, 17B, 18A, and 18B, the second substrate 70 may include the first portion 71, which is formed of or includes a doped semiconductor material of first conductivity type (e.g., n-type), and the second portion 73 and the third portion 75, which are formed of or include a doped semiconductor material of second conductivity type (e.g., p-type). The first portion 71 of the second substrate 70 may correspond to the common source line CSL of FIG. 1 or the common source line 4205 of FIGS. 3 and 4. A bottom surface of the first portion 71 of the second substrate 70 may be in contact with a top surface STb of the topmost one of the first interlayer dielectric layers ILDa, and a top surface of the first portion 71 of the second substrate 70 may be in contact with a bottom surface of the fifth insulating layer 80.

Although not shown, the second separation pattern SP2 may include a conductive contact, which is provided therein, and the conductive contact in the second separation pattern SP2 may be in contact with and electrically connected to the first portion 71 of the second substrate 70.

The three-dimensional semiconductor memory device described with reference to FIGS. 17A and 17B may differ from the three-dimensional semiconductor memory device described with reference to FIGS. 5, 6A, and 6B and the three-dimensional semiconductor memory device described with reference to FIGS. 15A and 15B in terms of their erasing methods. For example, the three-dimensional semiconductor memory device described with reference to FIGS. 17A and 17B may be configured to perform the erase operation using a gate-induced leakage current (GIDL) phenomenon.

The top surfaces VS1t of the first vertical channel structures VS1 may be in contact with the first portion 71 of the second substrate 70. The vertical semiconductor pattern VSP of each of the first vertical channel structures VS1 may be in contact with the first portion 71 of the second substrate 70. The top surfaces VS2t of the second vertical channel structures VS2 may be in contact with the second portion 73 of the second substrate 70, and the top surfaces VS3t of the third vertical channel structures VS3 may be in contact with the third portion 75 of the second substrate 70. The vertical semiconductor pattern VSP of each of the second vertical channel structures VS2 may be in contact with the second portion 73 of the second substrate 70, and the vertical semiconductor pattern VSP of each of the third vertical channel structures VS3 may be in contact with the third portion 75 of the second substrate 70.

In each of the first to third vertical channel structures VS1, VS2, and VS3, the data storage pattern DSP may be provided to enclose a side surface of the vertical semiconductor pattern VSP. The data storage pattern DSP may include a protruding portion DSPp, which is provided between the vertical semiconductor pattern VSP and the second substrate 70 to protrude in the first direction D1, and a portion of the vertical semiconductor pattern VSP, which is enclosed by the protruding portion DSPp of the data storage pattern DSP, may be in contact with the second substrate 70.

According to an embodiment of inventive concepts, a three-dimensional semiconductor memory device may include a first substrate, a peripheral circuit structure, which is provided on the first substrate and includes peripheral transistors, and a cell array structure, which is coupled to the peripheral circuit structure through bonding pads, and the cell array structure may include a stack and a second substrate on the stack. The second substrate may include doped portions of different conductivity types, and during an erase operation, a reverse junction may form between the doped portions of different conductivity types. Accordingly, during the erase operation, dummy vertical channel structures may be in an electrically floated state, and thus, it may be possible to prevent, limit, or suppress a failure from occurring in the erase operation and thereby to improve electrical characteristics and reliability of the three-dimensional semiconductor memory device.

Furthermore, the three-dimensional semiconductor memory device according to an embodiment of inventive concepts may have an increased cell capacity per unit area, because the cell array structure is provided on and coupled to the peripheral circuit structure. The peripheral circuit structure and the cell array structure may be separately fabricated and then may be coupled to each other, and in this case, it may be possible to limit and/or prevent the peripheral transistors from being damaged by several thermal treatment processes. Accordingly, the electrical characteristics and reliability of the three-dimensional semiconductor memory device may be improved.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While example embodiments of inventive concepts have been particularly shown and described, it will be understood by one of ordinary skill in the art that variations in form and detail may be made therein without departing from the spirit and scope of the attached claims.

What is claimed is:

1. A three-dimensional semiconductor memory device, comprising:
a first substrate including a cell array region and a cell array contact region;
a peripheral circuit structure on the first substrate; and
a cell array structure including a stack, first vertical channel structures, second vertical channel structures, and a second substrate,
the stack being on the peripheral circuit structure,
the first vertical channel structures and the second vertical channel structures being on the cell array region and penetrating the stack, and
the second substrate being connected to the first vertical channel structures and the second vertical channel structures,
the stack between the peripheral circuit structure and the second substrate,
the second substrate including a first portion, a second portion, and a third portion,
the first portion being in contact with the first vertical channel structures and doped to have a first conductivity type, the second portion being in contact with the second vertical channel structures and doped to have a second conductivity type different from the first conductivity type, and the third portion being on the cell array contact region and doped to have the second conductivity type.

2. The three-dimensional semiconductor memory device of claim 1, wherein the second portion encloses a portion of each of the second vertical channel structures.

3. The three-dimensional semiconductor memory device of claim 1, further comprising:
a first separation pattern on the cell array region and crossing the stack; and
a second separation pattern extending from the cell array region toward the cell array contact region,
wherein the second portion vertically overlaps the first separation pattern.

4. The three-dimensional semiconductor memory device of claim 1, wherein
the cell array structure further comprises third vertical channel structures on the cell array contact region,
the third vertical channel structures penetrate at least a portion of the stack and contact the third portion of the second substrate, and
each of the first vertical channel structures penetrates at least a portion of the first portion.

5. The three-dimensional semiconductor memory device of claim 4, wherein
the first portion of the second substrate comprises a common source region on the stack and a source conductive pattern between the stack and the common source region,
an impurity concentration of the source conductive pattern is different from an impurity concentration of the common source region,
each of the first vertical channel structures comprises a data storage pattern and a vertical semiconductor pattern enclosed by the data storage pattern,
the data storage pattern contacts a side surface of the stack, and
the source conductive pattern contacts the vertical semiconductor pattern.

6. The three-dimensional semiconductor memory device of claim 5, wherein
the first vertical channel structures are in contact with the common source region, and
top surfaces of the first vertical channel structures are at a level higher than a top surface of the source conductive pattern.

7. The three-dimensional semiconductor memory device of claim 5, wherein
the common source region is a plate-shaped pattern that extends parallel to a top surface of the first substrate.

8. The three-dimensional semiconductor memory device of claim 5, wherein
top surfaces of the second vertical channel structures and top surfaces of the third vertical channel structures are located at a level lower than top surfaces of the first vertical channel structures, and
top surfaces of the second vertical channel structures and top surfaces of the third vertical channel structures are coplanar with a bottom surface of the second substrate.

9. The three-dimensional semiconductor memory device of claim 4, wherein
each of the second vertical channel structures penetrates at least a portion of the second portion,
each of the third vertical channel structures penetrates at least a portion of the third portion,
each of the first vertical channel structures, the second vertical channel structures, and the third vertical channel structures comprise a data storage pattern and a vertical semiconductor pattern enclosed by the data storage pattern,
the data storage pattern contacts a side surface of the stack, and
a top surface of the vertical semiconductor pattern directly contacts the second substrate.

10. The three-dimensional semiconductor memory device of claim 1, wherein
the peripheral circuit structure comprises peripheral transistors on the first substrate and first bonding pads connected to the peripheral transistors,
the cell array structure further comprises bit lines, conductive lines, and second bonding pads,
the bit lines are connected to the first vertical channel structures,
the conductive lines are spaced apart from the bit lines in a horizontal direction,
the second bonding pads are connected to the bit lines or the conductive lines, and
the first bonding pads are integrally bonded with the second bonding pads.

11. The three-dimensional semiconductor memory device of claim 1, wherein widths of the first vertical channel structures and the second vertical channel structures decrease with increasing distance from the first substrate.

12. The three-dimensional semiconductor memory device of claim 1, wherein
the stack comprises interlayer dielectric layers and gate electrodes, which are alternately and repeatedly stacked and extend in a direction parallel to a top surface of the first substrate, and
lengths of the gate electrodes, in the direction parallel to the top surface of the first substrate, increase with increasing distance from the first substrate.

13. A three-dimensional semiconductor memory device, comprising:
a first substrate including a cell array region and a cell array contact region;
a peripheral circuit structure including peripheral transistors, peripheral circuit interconnection lines, and first bonding pads,
the peripheral transistors being on the first substrate,
the peripheral circuit interconnection lines being on the peripheral transistors, and
the first bonding pads being connected to the peripheral transistors through the peripheral circuit interconnection lines; and
a cell array structure including second bonding pads, connection circuit interconnection lines, bit lines, a stack on the bit lines, first vertical channel structures, second vertical channel structures, third vertical channel structures, and a second substrate,
the connection circuit interconnection lines being on the second bonding pads, the bit lines being connected to the second bonding pads through the connection circuit interconnection lines, the first vertical channel structures to the third vertical channel structures penetrating the stack, and
the second substrate being connected to the first vertical channel structures to the third vertical channel structures, the second bonding pads being integrally bonded to the first bonding pads of the peripheral circuit structure, the stack being located between the peripheral circuit structure and the second substrate, the stack including interlayer dielectric layers and gate electrodes, which are alternately and repeatedly stacked and extend in a direction parallel to a top surface of the first substrate, the first vertical channel structures to the third vertical channel structures being in vertical channel holes penetrating the stack, each of the first vertical channel structures, the second vertical channel structures, and the third vertical channel structures including a data storage pattern and a vertical semiconductor pattern enclosed by the data storage pattern, the data storage pattern conformally covering an inner side surface of each of the vertical channel holes, the data storage pattern including a blocking insulating layer, a charge storing layer, and a tunneling insulating layer, which are sequentially stacked, the first vertical channel structures and the second vertical channel structures being on the cell array region, the third vertical channel structures being on the cell array contact region, and the second substrate including a first portion, a second portion, and a third portion, the first portion being in contact with the first vertical channel structures and doped to have a first conductivity type, the second portion being in contact with the second vertical channel structures and doped to have a second conductivity type different from the first conductivity type, and the third portion being in contact with the third vertical channel structures and doped to have the second conductivity type.

14. The three-dimensional semiconductor memory device of claim 13, wherein widths of the first vertical channel structures to the third vertical channel structures decrease with increasing distance from the first substrate, and lengths of the gate electrodes, in the direction parallel to the top surface of the first substrate, increase with increasing distance from the first substrate.

15. The three-dimensional semiconductor memory device of claim 13, wherein the first bonding pads and the second bonding pads comprise copper (Cu).

16. The three-dimensional semiconductor memory device of claim 13, wherein each of the vertical channel holes comprises a first vertical channel hole and a second vertical channel hole connected to the first vertical channel hole, and the first vertical channel holes and the second vertical channel holes have different diameters from each other near a boundary region where the first vertical channel holes and the second vertical channel holes are connected to each other.

17. The three-dimensional semiconductor memory device of claim 13, further comprising:

a first separation pattern on the cell array region and crossing the stack; and a second separation pattern extending from the cell array region toward the cell array contact region, wherein the second portion vertically overlaps the first separation pattern.

18. The three-dimensional semiconductor memory device of claim 13, wherein each of the first vertical channel structures penetrates at least a portion of the first portion.

19. An electronic system, comprising:

a three-dimensional semiconductor memory device including a first substrate including a cell array region and a cell array contact region, a peripheral circuit structure on the first substrate, and a cell array structure, the cell array structure including a stack, first vertical channel structures, second vertical channel structures, a second substrate, and an input/output pad, the stack being on the peripheral circuit structure, the first vertical channel structures and the second vertical channel structures being on the cell array region and penetrating the stack, the second substrate connected to the first vertical channel structures and the second vertical channel structures, the input/output pad being on the cell array structure, the stack being located between the peripheral circuit structure and the second substrate, the second substrate including a first portion, a second portion, and a third portion, the first portion being in contact with the first vertical channel structures and doped to have a first conductivity type, the second portion being in contact with the second vertical channel structures and doped to have a second conductivity type different from the first conductivity type, and the third portion being on the cell array contact region and doped to have the second conductivity type; and a controller connected to the three-dimensional semiconductor memory device through the input/output pad, the controller configured to control the three-dimensional semiconductor memory device.

20. The electronic system of claim 19, wherein the peripheral circuit structure comprises peripheral transistors on the first substrate and first bonding pads connected to the peripheral transistors, the cell array structure further comprises bit lines, conductive lines, and second bonding pads, the bit lines are connected to the first vertical channel structures, the conductive lines are spaced apart from the bit lines in a horizontal direction, the second bonding pads are connected to the bit lines or the conductive lines, and the first bonding pads being integrally bonded with the second bonding pads.

\* \* \* \* \*